(12) United States Patent
Kwon et al.

(10) Patent No.: US 12,740,192 B2
(45) Date of Patent: Sep. 15, 2026

(54) LIGHT-EMITTING DEVICE, DISPLAY APPARATUS INCLUDING THE SAME AND METHOD FOR MANUFACTURING THE DEVICE AND APPARATUS

(71) Applicant: LG Display Co., Ltd., Seoul (KR)

(72) Inventors: Hyowon Kwon, Suwon-si (KR); Il-Soo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 345 days.

(21) Appl. No.: 18/531,846

(22) Filed: Dec. 7, 2023

(65) Prior Publication Data

US 2024/0213408 A1 Jun. 27, 2024

(30) Foreign Application Priority Data

Dec. 26, 2022 (KR) ........................ 10-2022-0184329

(51) Int. Cl.
*H10H 20/825* (2025.01)
*H10H 20/819* (2025.01)
(Continued)

(52) U.S. Cl.
CPC ........ *H10H 20/825* (2025.01); *H10H 20/819* (2025.01); *H10H 20/831* (2025.01); *H10H 20/832* (2025.01); *H10H 20/84* (2025.01)

(58) Field of Classification Search
CPC ............... H10H 20/825; H10H 20/819; H10H 20/831; H10H 20/832; H10H 20/84;
(Continued)

(56) References Cited

U.S. PATENT DOCUMENTS 4,826,787 A * 5/1989 Muto .................. H10P 90/1914 257/E21.705
7,692,179 B2 * 4/2010 Islam .................. H10D 86/201 257/14

(Continued)

FOREIGN PATENT DOCUMENTS

KR 2002-0085978 A 11/2002
KR 10-2009-0106301 A 10/2009

(Continued)

OTHER PUBLICATIONS

European Patent Office, Extended European Search Report, European Patent Application No. 23220361.2, Jun. 12, 2024, nine pages.

(Continued)

*Primary Examiner* — Victor A Mandala
(74) *Attorney, Agent, or Firm* — Fenwick & West LLP

(57) ABSTRACT

A light-emitting device, display apparatus including the same and method for manufacturing the device and apparatus are disclosed. The light-emitting device includes a nitride semiconductor structure including a first semiconductor layer, an active layer and a second semiconductor layer; a passivation pattern disposed on an outer surface of the nitride semiconductor structure; a first electrode connected to the first semiconductor layer; and a second electrode spaced apart from the first electrode and connected to the second semiconductor layer, wherein each of the first electrode and the second electrode includes a silicide alloy. Accordingly, the defect in manufacturing the electrode of the light-emitting device due to the bowing phenomenon of the growth substrate may be removed.

17 Claims, 19 Drawing Sheets

(51) Int. Cl.
*H10H 20/831* (2025.01)
*H10H 20/832* (2025.01)
*H10H 20/84* (2025.01)

(58) Field of Classification Search
CPC ........... H10H 20/8312; H10H 20/0137; H10H 20/032; H10H 20/034; H10H 20/857; H10W 90/00; H10W 72/0198; G09F 9/33; H10D 86/441
See application file for complete search history.

(56) References Cited

U.S. PATENT DOCUMENTS

| | | | | |
|---|---|---|---|---|
| 8,932,890 | B2 | 1/2015 | Seong | |
| 11,316,072 | B2 | 4/2022 | Kim et al. | |
| 2001/0038103 | A1 | 11/2001 | Nitta et al. | |
| 2002/0168851 | A1 | 11/2002 | Park | |
| 2003/0183307 | A1* | 10/2003 | Liebeskind | H10W 90/00 257/E21.705 |
| 2003/0209715 | A1 | 11/2003 | Ikeda et al. | |
| 2009/0045427 | A1 | 2/2009 | Wierer, Jr. et al. | |
| 2011/0012169 | A1* | 1/2011 | Takizawa | H10P 14/2926 257/E33.025 |
| 2011/0024784 | A1* | 2/2011 | Song | H10H 20/84 257/98 |
| 2011/0140152 | A1 | 6/2011 | Song | |
| 2012/0220063 | A1 | 8/2012 | Seong | |
| 2015/0076444 | A1 | 3/2015 | Niikura | |
| 2016/0093666 | A1* | 3/2016 | Gilet | H10H 29/10 438/34 |
| 2016/0104743 | A1* | 4/2016 | Tchelnokov | H10H 29/10 438/23 |
| 2016/0190293 | A1* | 6/2016 | Wu | H10D 10/891 438/312 |
| 2017/0069792 | A1 | 3/2017 | Shibata | |
| 2019/0181301 | A1 | 6/2019 | Kim et al. | |
| 2019/0305182 | A1 | 10/2019 | Dasgupta et al. | |
| 2022/0037297 | A1* | 2/2022 | Lu | H10W 90/00 |
| 2022/0093834 | A1 | 3/2022 | Lin et al. | |
| 2022/0216376 | A1 | 7/2022 | Kim et al. | |

FOREIGN PATENT DOCUMENTS

| | | | |
|---|---|---|---|
| KR | 10-2020-0083160 | A | 7/2020 |
| KR | 10-2022-0104113 | A | 7/2022 |
| KR | 10-2022-0125137 | A | 9/2022 |
| TW | 201138168 | A | 11/2011 |
| TW | 201711220 | A | 3/2017 |
| TW | 202213311 | A | 4/2022 |

OTHER PUBLICATIONS

Taiwan Intellectual Property Office, Office Action, Taiwanese Patent Application No. 112149009, Oct. 23, 2024, 13 pages.

* cited by examiner

LIGHT-EMITTING DEVICE, DISPLAY APPARATUS INCLUDING THE SAME AND METHOD FOR MANUFACTURING THE DEVICE AND APPARATUS

CROSS-REFERENCE TO RELATED APPLICATION

This application claims priority from Republic of Korea Patent Application No. 10-2022-0184329 filed on Dec. 26, 2022 in the Korean Intellectual Property Office, and all the benefits accruing therefrom under 35 U.S.C. 119, which is incorporated by reference in its entirety.

BACKGROUND

Field

The present disclosure relates to a light-emitting device, and more specifically, provides a light-emitting device including a structure capable of preventing damage to the light-emitting device, a display apparatus including the same, and a method for manufacturing the device and the apparatus.

Description of Related Art

A display apparatus is applied to various electronic devices such as televisions TVs, mobile phones, laptops, and tablets.

Among display apparatus, a light-emitting display apparatus has a light-emitting device or a light source built therein and displays information using light generated from the built-in light-emitting device or light source. A display apparatus including a self-light-emitting device may be implemented to be thinner than a display apparatus with the built-in light source, and may be implemented as a flexible display apparatus that may be folded, bent, or rolled.

The display apparatus having the self-light-emitting device may include, for example, an organic light-emitting display apparatus (OLED) including a light-emitting layer made of an organic material, or a micro-LED display apparatus (micro light-emitting diode display apparatus) including a light-emitting layer made of an inorganic material. In this regard, the organic light-emitting display apparatus does not require a separate light source. However, due to material characteristics of the organic material that is vulnerable to moisture and oxygen, a defective pixel easily occurs in the organic light-emitting display apparatus due to an external environment. On the contrary, the micro-LED display apparatus includes the light-emitting layer made of the inorganic material that is resistant to moisture and oxygen and thus is not affected by the external environment and thus has high reliability and has a high image quality compared to the organic light-emitting display apparatus.

Since the micro-LED display apparatus is resistant to the external environment, the micro-LED display apparatus does not require a protective structure such as a sealing material, and various types of materials may be used as a material of a substrate of the device, thereby implementing a flexible display apparatus with a thinner structure than that of the organic light-emitting display apparatus. Accordingly, a plurality of micro-LED display apparatus may be arranged in first and second horizontal directions intersecting each other to implement a large-area tiling display apparatus.

Accordingly, research is being conducted to improve the characteristics of the device while increasing the light-emitting efficiency of the micro-LED display apparatus.

SUMMARY

A technical purpose according to an embodiment of the present disclosure is to provide a light-emitting device in which a manufacturing-related defect due to a bowing phenomenon of a growth substrate is reduced.

Moreover, a technical purpose according to an embodiment of the present disclosure is to reduce contact resistance between a pad electrode of a light-emitting device and a display apparatus to reduce power consumption.

Moreover, a technical purpose according to an embodiment of the present disclosure is to omit an exposure process for forming a pad electrode to reduce the total number of process steps to optimize the process.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims or combinations thereof.

In one embodiment, a light-emitting device comprises: a nitride semiconductor structure including a first semiconductor layer, an active layer on the first semiconductor layer, and a second semiconductor layer on the active layer; a passivation pattern on an outer surface of the nitride semiconductor structure; a first electrode connected to the first semiconductor layer; and a second electrode spaced apart from the first electrode and connected to the second semiconductor layer, wherein each of the first electrode and the second electrode includes a silicide alloy.

In one embodiment, a display apparatus comprises: a package substrate including a plurality of circuit elements, a first connection electrode, and a second connection electrode; and a light-emitting device connected to the package substrate, the light-emitting device including; a nitride semiconductor structure including a first semiconductor layer, an active layer on the first semiconductor layer, and a second semiconductor layer on the active layer; a passivation pattern on an outer surface of the nitride semiconductor structure; a first electrode connected to the first semiconductor layer and the first connection electrode of the package substrate; and a second electrode spaced apart from the first electrode and connected to the second semiconductor layer and the second connection electrode of the package substrate, wherein each of the first electrode and the second electrode includes a silicide alloy.

In one embodiment, a method for manufacturing a light-emitting device comprises: forming a nitride semiconductor structure on a growth substrate; forming a first silicide reaction pattern on a first portion of the nitride semiconductor structure and a second silicide reaction pattern on a second portion of the nitride semiconductor structure, the first silicide reaction pattern and the second silicide reaction pattern spaced apart from each other; forming a passivation pattern that covers an outer surface of the nitride semiconductor structure without covering a portion of the first silicide reaction pattern and a portion of the second silicide reaction pattern; forming a metal film in contact with the passivation pattern, the portion of the first silicide reaction pattern, and the portion of the second silicide reaction pattern; converting the first silicide reaction pattern, the second silicide reaction pattern, a portion of the metal film in contact with the portion of first silicide reaction pattern, and a portion of the metal film in contact with the portion of the second silicide reaction pattern into a first electrode and a second electrode including a silicide alloy under a silicide reaction; and removing a portion of the metal film where the silicide reaction does not occur.

In one embodiment, a method for manufacturing a display apparatus comprises: providing a light-emitting device that includes a nitride semiconductor structure, the nitride semiconductor structure including a first semiconductor layer, an active layer on the first semiconductor layer, a second semiconductor layer on the active layer, a first electrode connected to the first semiconductor layer, and a second electrode connected to the second semiconductor layer; providing a package substrate including a plurality of circuit elements, a first connection electrode, and a second connection electrode; placing the light-emitting device on the package substrate such that the second electrode of the light-emitting device faces the first connection electrode of the package substrate and is electrically connected to the first connection electrode; forming an insulating layer covering a side surface of the first semiconductor layer of the light-emitting device without covering a rear surface of the first semiconductor layer of the light-emitting device; forming a barrier pattern including a first pattern opening that extends through the insulating layer and exposes a portion of a surface of the second connection electrode, and a second pattern opening exposing a portion of the rear surface of the first semiconductor layer; forming a silicide reaction pattern in the first pattern opening and the second pattern opening; forming a metal film that contacts the silicide reaction pattern; converting the silicide reaction pattern and a portion of the metal film in contact with the silicide reaction pattern into a through-electrode that is connected to the second connection electrode and a first electrode under a silicide reaction, each of the through-electrode and the first electrode includes a silicide alloy; and removing a portion of the metal film where the silicide reaction does not occur.

In one embodiment, a light-emitting device comprises: a nitride semiconductor structure; and an electrode connected to a semiconductor layer of the nitride semiconductor structure, the electrode including a silicide alloy.

According to the embodiment of the present disclosure, the electrodes of the light-emitting device may be formed using a saliside process in a self-aligning scheme. Thus, the exposure process step for forming the electrodes may be omitted. Accordingly, since a separate exposure process is absent, a margin may be secured when transferring the light-emitting device to a panel substrate.

Moreover, the exposure process for forming the electrodes of the light-emitting device may be omitted, thereby reducing the total number of process steps, thereby optimizing the process.

Moreover, as the electrode of the light-emitting device is composed of the silicide alloy material with a low work function and low resistance, the current injection amount into the light-emitting device increases. This may increase the luminous efficiency, thereby reducing power consumption. A product can operate at a low power level.

Effects of the present disclosure are not limited to the effects mentioned above, and other effects not mentioned will be clearly understood by those skilled in the art from the descriptions below.

DETAILED DESCRIPTIONS

Figure 1:
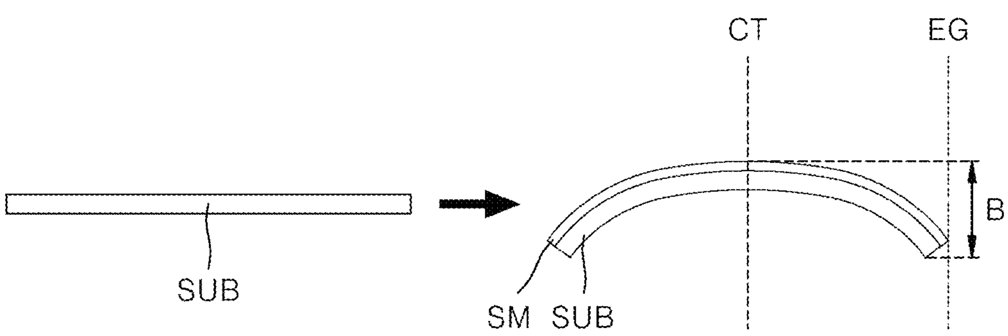
FIG. 1 is a diagram for illustrating a display apparatus.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing embodiments of the present disclosure are illustrative, and the present disclosure is not limited thereto. The same reference numerals refer to the same elements herein. Further, descriptions and details of well-known steps and elements are omitted for simplicity of the description.

The terminology used herein is directed to the purpose of describing particular embodiments only and is not intended to be limiting of the present disclosure. As used herein, the singular constitutes "and" and "a" are intended to include the plural constitutes as well, unless the context clearly indicates otherwise. It will be further understood that the terms "comprises", "including", and "includes" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when being immediately adjacent to a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element or layer may be disposed directly on the second element or layer, or may be disposed indirectly on the second element or layer with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described under could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is separate explicit description thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, "embodiments," "examples," "aspects", and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, a display apparatus according to each embodiment of the present disclosure will be described with reference to the accompanying drawings.

Figure 2:
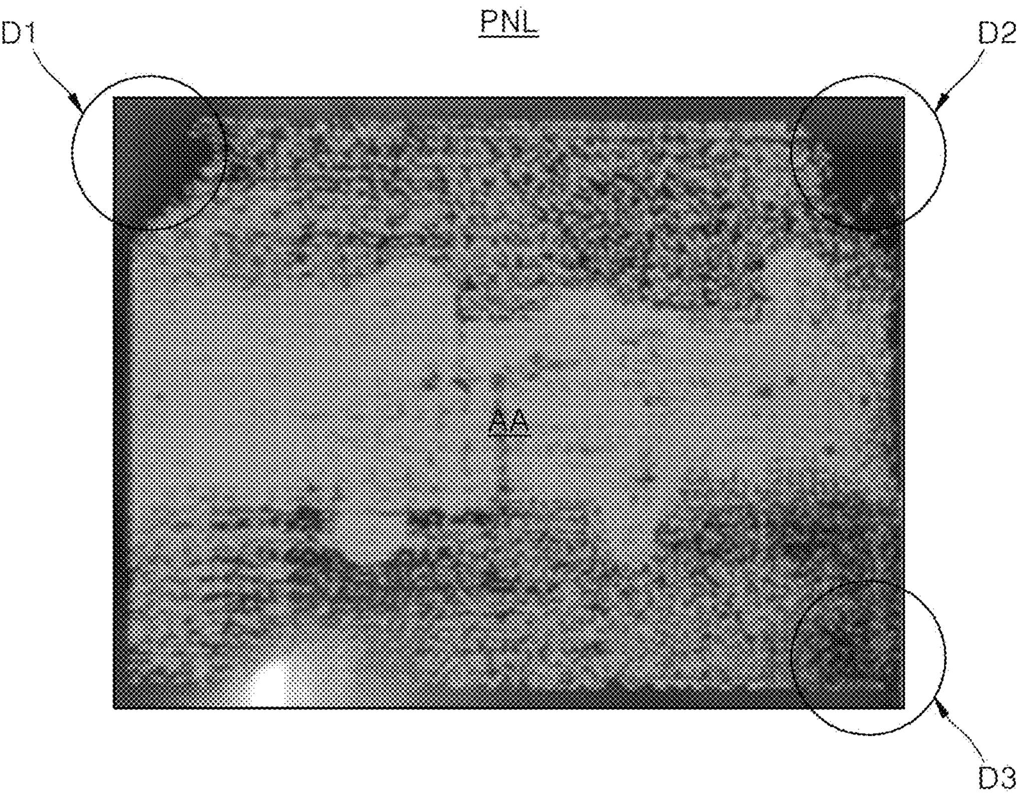
FIG. 2 is a diagram illustrating a defect that may occur on the display apparatus.

FIG. 1 is a diagram to illustrate a bowing phenomenon of the display apparatus. FIG. 2 is a diagram showing a light emission defect that occurs on the display apparatus.

Referring to FIG. 1 and FIG. 2, in order to form a plurality of light-emitting devices, a nitride semiconductor material layer SM is formed on a growth substrate SUB and a patterning process is performed thereon to form a nitride semiconductor structure. However, in a process of performing a plurality of processes to form the light-emitting device, the growth substrate SUB may experience a bowing (B) phenomenon in which the growth substrate SUB is bent toward both opposing edges EG around a central portion CT. The bowing phenomenon may be caused by a difference between thermal expansion coefficients of the nitride semiconductor material layer SM and the growth substrate SUB and a difference between lattice constants of the nitride semiconductor material layer SM and the growth substrate SUB when the nitride semiconductor material layer SM is grown on the growth substrate SUB.

This bowing phenomenon may cause a defect when the light-emitting device is manufactured or when the manufactured light-emitting device is transferred to a panel substrate.

As a size of the light-emitting device gradually decreases and a size of the growth substrate gradually increases to increase a production amount of the light-emitting devices, the defect in the manufacturing of the light-emitting device due to the bowing phenomenon of the growth substrate may increase. The growth substrate subjected to the bowing phenomenon may be restored to a flat state in a process of separating the light-emitting devices formed on the growth substrate into individual light-emitting devices. However, the growth substrate may be restored to the flat state irregularly. Then, during an exposure process in a process of forming an electrode formed for electrical connection between the light-emitting device and the panel substrate, a defect may occur. As a result, the electrode may be formed to be positionally biased in one direction, or a size of the electrode may be smaller than a target value, resulting in the formation of a defective electrode.

When the light-emitting device equipped with the defective electrode is transferred to the panel substrate, the electrical connection between the panel substrate and the light-emitting device is not established. Thus, as shown in FIG. 2, for example, operation defects D1, D2, and D3 in which the light-emitting device does not emit light may occur on the display area AA of the panel substrate PNL.

Accordingly, there is a demand for a method capable of removing the defect in manufacturing the electrode of the light-emitting device due to the bowing phenomenon of the growth substrate.

Figure 3:
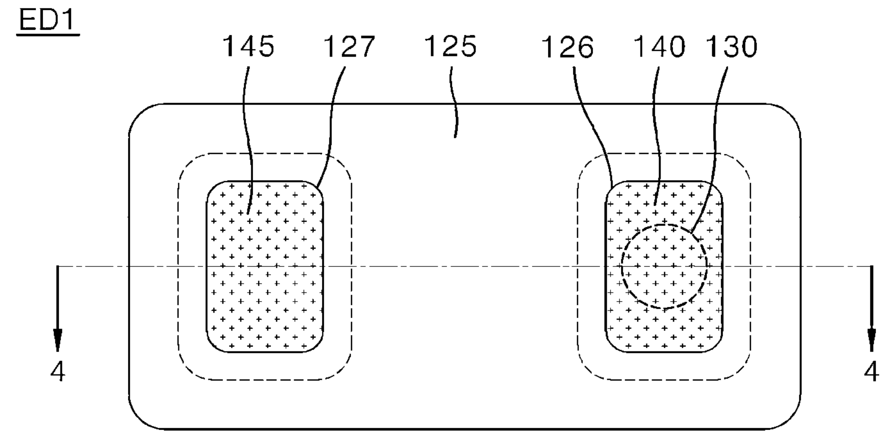
FIG. 3 and FIG. 4 are views showing a light-emitting device according to an embodiment of the present disclosure.
Figure 4:
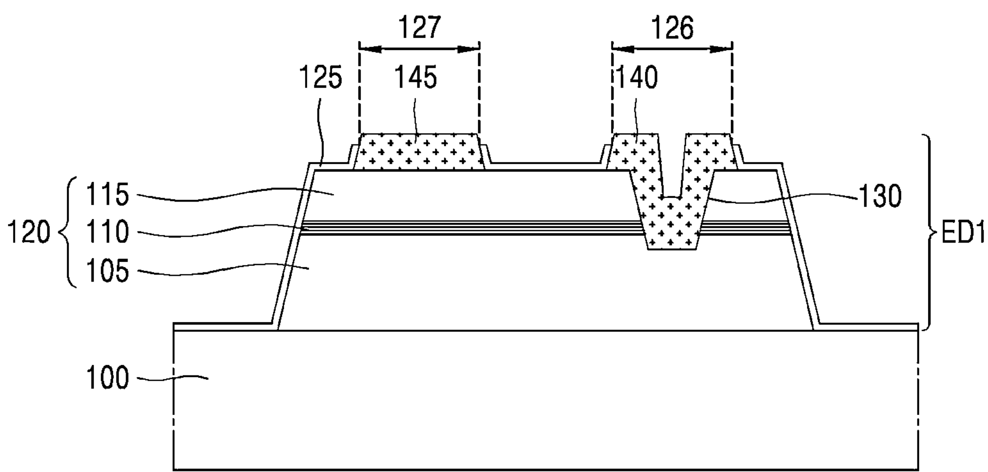

FIG. 3 and FIG. 4 are diagrams showing a light-emitting device ED1 according to an embodiment of the present disclosure. In this regard, FIG. 3 is a plan view of the light-emitting device ED1. A cross-sectional view of FIG. 3 is shown in FIG. 4.

Referring to FIGS. 3 and 4, a light-emitting device ED1 according to an embodiment of the present disclosure may be disposed on the growth substrate 100. A plurality of light-emitting devices ED1 may be spaced apart from each other while being disposed on the growth substrate 100. The light-emitting device ED1 may be understood as a component other than the growth substrate 100.

The light-emitting device ED1 may include a nitride semiconductor structure 120, a passivation pattern 125, a first electrode 140, and a second electrode 145. The nitride semiconductor structure 120 may include a first semiconductor layer 105, an active layer 110 on the first semiconductor layer 105, and a second semiconductor layer 115 on the active layer 110. The nitride semiconductor structure 120 may further include a trench hole 130 that is defined at one side of the nitride semiconductor structure 120 and extends through the second semiconductor layer 115, the active layer 110, and a portion of the first semiconductor layer 105 so as to expose a portion of a surface of the first semiconductor layer 105. In one embodiment, the trench hole 130 extends through an entire thickness of the second semiconductor layer 115 and the active layer 110 and through a portion of the first semiconductor layer 105 without extending through an entire thickness of the first semiconductor layer 105.

The first electrode 140 may fill the trench hole 130 so as to contact the first semiconductor layer 105, and may have a top portion that is not disposed within the trench hole 130 and is coplanar with the second electrode 145.

The passivation pattern 125 is disposed on an outer surface of the nitride semiconductor structure 120. The passivation pattern 125 may cover the outer surface of the nitride semiconductor structure 120. That is, a side surface of the first semiconductor layer 105, a side surface of the active layer 110, and a side surface of the second semiconductor layer 115 of the nitride semiconductor structure 120 are aligned with each other and form an inclined surface, and the passivation pattern 125 is on the inclined surface and an upper surface of the second semiconductor layer 115. The passivation pattern 125 may extend to cover a side surface of each of the first electrode 140 and the second electrode 145 by a portion of a height thereof. The passivation pattern 125 serves to prevent or at least reduce damage that may occur on the side surface of the nitride semiconductor structure 120 in a dry etching process performed to form the nitride semiconductor structure 120 to supplement (and protect) the characteristics of the device.

The passivation pattern 125 may include a first open area 126 (e.g., a first opening) exposing a portion of a surface of the first electrode 140 (e.g., an upper surface and a portion of a side surface) and a second open area 127 exposing a portion of a surface of the second electrode 145 (e.g., an upper surface and a portion of a side surface). The first electrode 140 is connected to a portion of the first semiconductor layer 105 exposed through the trench hole 130. The second electrode 145 is connected to the second semiconductor layer 115. The first electrode 140 and the second electrode 145 may be spaced apart from each other in the horizontal direction and may be insulated from each other via the passivation pattern 125.

Each of the first electrode 140 and the second electrode 145 may include a silicide alloy. For example, each of the first electrode 140 and the second electrode 145 may include titanium silicide ($TiSi_2$), cobalt silicide ($CoSi_2$) or nickel silicide ($NiSi_2$). The light-emitting device ED1 according to an embodiment of the present disclosure may have a flip chip shape.

Figure 5:
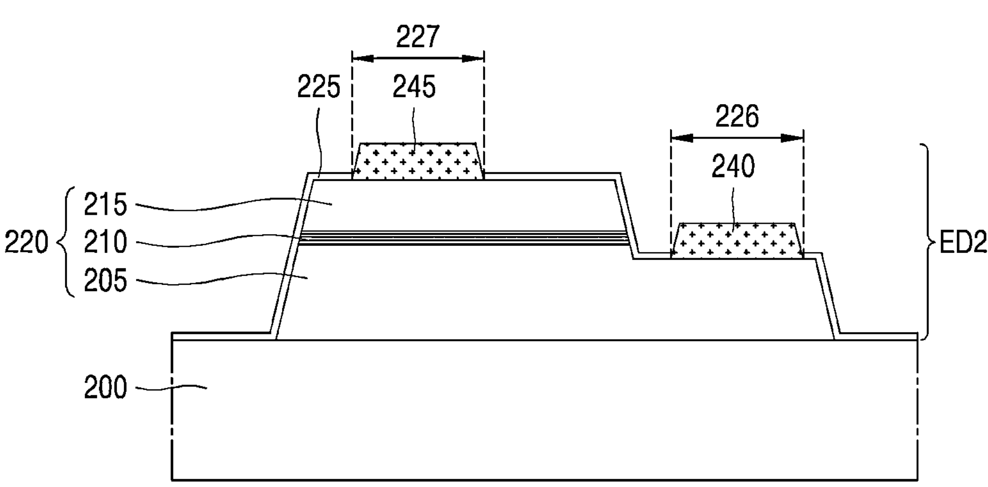
FIG. 5 is a diagram showing a light-emitting device according to another embodiment of the present disclosure.

FIG. 5 is a diagram showing a light-emitting device according to another embodiment of the present disclosure.

Referring to FIG. 5, a light-emitting device ED2 may include a nitride semiconductor structure 220, a passivation pattern 225, a first electrode 240, and a second electrode 245. The nitride semiconductor structure 220 may be disposed on the growth substrate 200. Since the light-emitting device ED2 according to the embodiment of the present disclosure is the same as the light-emitting device ED1 according to the embodiment of FIG. 4 except that the device ED2 has a mesa structure, the difference therebetween will be described and descriptions of the same components may be omitted.

The nitride semiconductor structure 220 may include a first semiconductor layer 205, an active layer 210 on the first semiconductor layer 205, and a second semiconductor layer 215 on the active layer 210. The active layer 210 and the second semiconductor layer 215 of the nitride semiconductor structure 220 may be disposed at a first side of the first semiconductor layer 205, while a second side of the first semiconductor layer 205 that is spaced apart from the first side may have a step as a portion of a surface of an upper portion of the first semiconductor layer 205 is exposed via mesa etching. That is, the first semiconductor layer 205 has a first portion having a first height and a second portion having a second height that is lower than the first height such that a step is formed between the first portion and the second portion. In one embodiment, the active layer 210 and the second semiconductor layer 215 are on the first portion of the first semiconductor layer 205 without being on the second portion of the first semiconductor layer 205 as shown in FIG. 5. Furthermore, the first electrode 240 is in contact with the first semiconductor layer 205 through the first opening 226 in the passivation layer 225.

The passivation pattern 225 may be disposed on an outer surface of the nitride semiconductor structure 220. The passivation pattern 225 may include a first open area 226 (e.g., a first opening) exposing a portion of a surface of the first electrode 240 and a second open area 227 (e.g., a second opening) exposing a portion of a surface of the second electrode 245. The first electrode 240 is in contact with a portion (e.g., the second portion) of the first semiconductor layer 205 exposed through the first open area 226. The second electrode 245 is connected to a portion of the second semiconductor layer 215 exposed through the second open area 227. The first electrode 240 and the second electrode 245 may be insulated from each other via the passivation pattern 225.

Each of the first electrode 240 and the second electrode 245 may include a silicide alloy. For example, each of the first electrode 240 and the second electrode 245 may include titanium silicide ($TiSi_2$), cobalt silicide ($CoSi_2$) or nickel silicide ($NiSi_2$).

Figure 6:
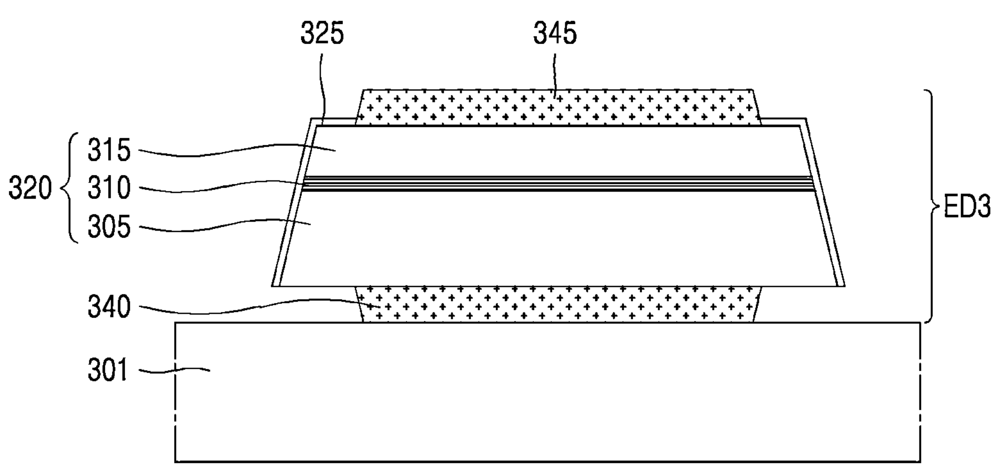
FIG. 6 is a diagram showing a light-emitting device according to still another embodiment of the present disclosure.

FIG. 6 is a diagram showing a light-emitting device according to still another embodiment of the present disclosure.

Referring to FIG. 6, a light-emitting device ED3 may include a nitride semiconductor structure 320, a passivation pattern 325, a first electrode 340, and a second electrode 345. Since the light-emitting device ED3 according to the embodiment of the present disclosure is different from the light-emitting device ED2 according to the embodiment of FIG. 5 in that the device ED3 has a vertical structure, the difference therebetween will be described.

The nitride semiconductor structure 320 may include a first semiconductor layer 305, an active layer 310 on the first semiconductor layer 305, and a second semiconductor layer 315 on the active layer 310. In the nitride semiconductor structure 320, a side of the first semiconductor layer 305, a side of the active layer 310, and a side of the second semiconductor layer 315 may be aligned with each other in a line. In one example, the nitride semiconductor structure 320 may have a shape in which a width thereof gradually decreases as the structure 320 extends in a direction from the first semiconductor layer 305 toward the second semiconductor layer 315. In this case, a side surface of the nitride semiconductor structure 320 may have an inclined surface. That is, a first side surface of the first semiconductor layer 305 at a first side (e.g., a left side) of the first semiconductor layer 305, a first side surface of the active layer 310 at a first side (e.g., a left side) of the active layer 310, and a first side surface of the second semiconductor layer 315 at a first side (e.g., a left side) of the second semiconductor layer 315 are aligned with each other to form a first inclined surface (e.g., a left inclined surface). Similarly, a second side surface of the first semiconductor layer 305 at a second side (e.g., a right side) of the first semiconductor layer 305, a second side surface of the active layer 310 at a second side (e.g., a right side) of the active layer 310, and a second side surface of the second semiconductor layer 315 at a second side (e.g., a right side) of the second semiconductor layer 315 are aligned with each other to form a second inclined surface (e.g., a right inclined surface).

An outer surface of the nitride semiconductor structure 320 may be covered with a passivation pattern 325. For example, the passivation pattern 325 is on the first inclined surface and the second inclined surface. The passivation pattern 325 may extend and cover a portion of an upper surface of the second semiconductor layer 315 but is not on a lower surface of the first semiconductor layer 305. The first electrode 340 is connected to the first semiconductor layer 305 on the lower surface of the first semiconductor layer 305. The second electrode 345 is connected to the second semiconductor layer 315 on the upper surface of the second semiconductor layer 315 through an opening in the passivation pattern 325. As the light-emitting device ED3 has a vertical structure, the first electrode 340 may also be referred to as a lower electrode, and the second electrode 345 may also be referred to as an upper electrode.

Each of the first electrode 340 and the second electrode 345 may include a silicide alloy. For example, each of the first electrode 340 and the second electrode 345 may include titanium silicide ($TiSi_2$), cobalt silicide ($CoSi_2$) or nickel silicide ($NiSi_2$). The light-emitting device ED3 may be disposed on a transfer substrate 301.

Figure 7:
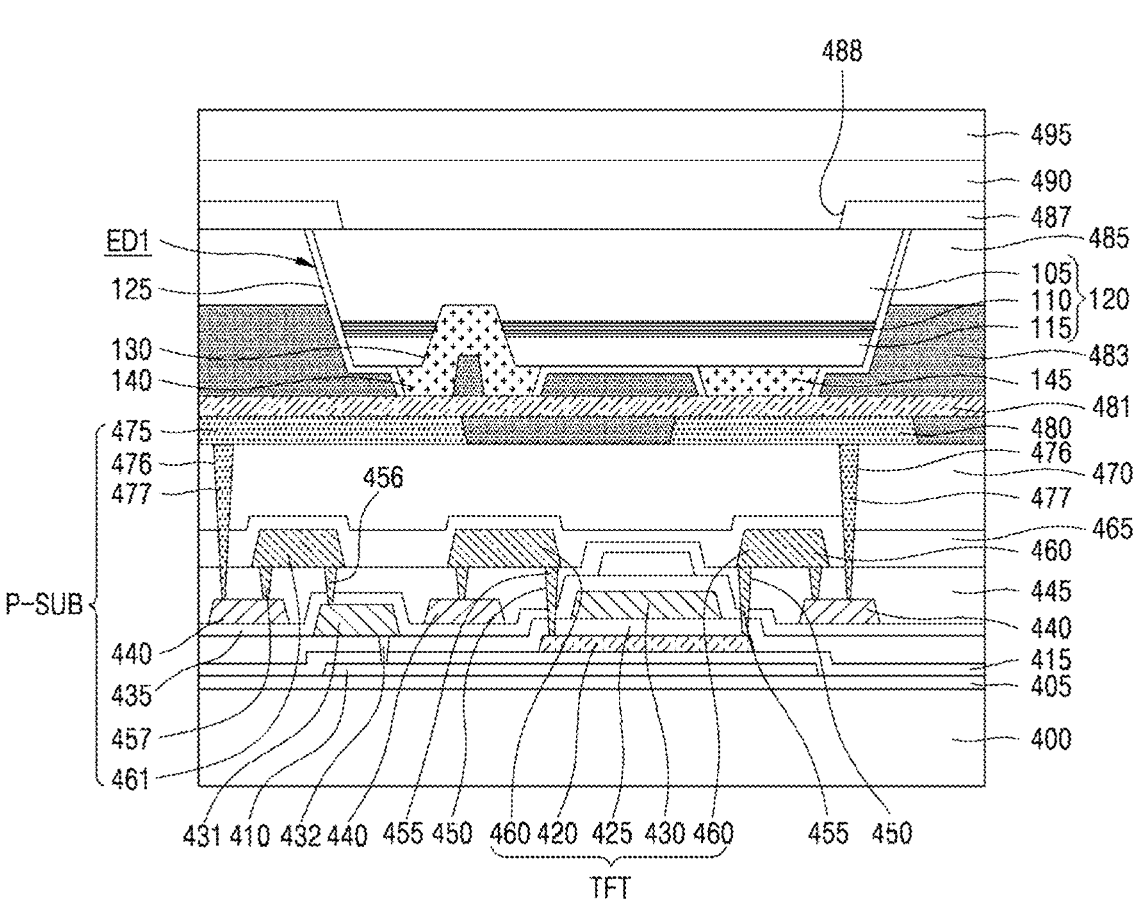
FIG. 7 is a diagram showing a display apparatus according to an embodiment of the present disclosure.

FIG. 7 is a diagram showing a display apparatus according to an embodiment of the present disclosure.

Referring to FIG. 7, the display apparatus according to an embodiment of the present disclosure includes a configuration in which a light-emitting device is bonded onto a package substrate P-SUB. For example, the light-emitting device may be the light-emitting device ED1 according to the embodiment of FIG. 3 of the present disclosure.

The light-emitting device ED1 may include the nitride semiconductor structure 120, the passivation pattern 125, the first electrode 140, and the second electrode 145. The nitride semiconductor structure 120 may include the first semiconductor layer 105, the active layer 110, and the second semiconductor layer 115. The outer surface of the nitride semiconductor structure 120 may be covered with the passivation pattern 125.

Each of the first electrode 140 and the second electrode 145 may include a silicide alloy. For example, each of the first electrode 140 and the second electrode 145 may include titanium silicide ($TiSi_2$), cobalt silicide ($CoSi_2$) or nickel silicide ($NiSi_2$). The first electrode 140 may fill the trench hole 130 extending through the second semiconductor layer 115 and the active layer 110 so as to expose a portion of the surface of the first semiconductor layer 105, and thus may contact the first semiconductor layer 105. The second electrode 145 may be connected to the second semiconductor layer 115.

A plurality of circuit elements for driving the light-emitting device ED1 are disposed in the package substrate P-SUB.

For example, the light-emitting device ED1 may be disposed on the package substrate P-SUB. A thin-film transistor TFT may be disposed on a base substrate 400. The thin-film transistor TFT may include a semiconductor layer 420 formed on the base substrate 400, a gate electrode 430 disposed on the semiconductor layer 420, a gate insulating layer 425 between the semiconductor layer 420 and the gate electrode 430, and source and drain electrodes 460. A buffer layer 405 and a light blocking film 410 may be disposed between the base substrate 400 and the semiconductor layer 420. Embodiments of the present disclosure are not limited thereto.

The buffer layer 405 may prevent or at least reduce diffusion of impurities or moisture in a direction from the base substrate 400 to the thin-film transistor TFT, and may include an inorganic insulation material. In one example, the buffer layer 405 may include silicon nitride or silicon oxide. The buffer layer 405 may be formed as a single layer or a stack of multiple layers. Embodiments of the present disclosure are not limited thereto.

When the semiconductor layer 420 includes, for example, a metal oxide semiconductor, the light-blocking layer 410 serves to prevent light entering the semiconductor layer 420. A first interlayer insulating layer 415 may be disposed between the buffer layer 405, the light-blocking layer 410, and the semiconductor layer 420.

The gate electrode 430 may be disposed on the gate insulating layer 425 so as to overlap the semiconductor layer 420. A second interlayer insulating layer 435 and a third interlayer insulating layer 445 may be sequentially disposed on the gate electrode 430.

A plurality of connection lines 440 may be disposed on the second interlayer insulating layer 435. The third interlayer insulating layer 445 may be disposed on the second interlayer insulating layer 435 and may be formed to cover the plurality of connection lines 440. The source and drain electrodes 460 may be disposed on the third interlayer insulating layer 445 with the gate electrode 430 interposed therebetween. Each of source and drain contact-holes 450 may extend through the third interlayer insulating layer 445, the second interlayer insulating layer 435, and the gate insulating layer 425 so as to expose a portion of each of source and drain areas of the semiconductor layer 420. Each of the source and drain contact-holes 450 may be filled with a conductive material or a metal material to constitute each of source and drain contacts 455. Each of the source and drain electrodes 460 may be electrically connected to the semiconductor layer 420 and at least one connection line 440 via each of the source and drain contacts 455. In this case, one side of each of the source and drain electrodes 460 may be connected to the semiconductor layer 420 and the other side thereof may be connected to the connection line 440. The connection line 440 may include a wiring line such as a common voltage line.

A first interlayer connection electrode 461 may be disposed on the same plane as the source and drain electrodes 460. The first interlayer connection electrode 461 may be electrically connected to the light-blocking layer 410 via a first interlayer connection portion 456, a second interlayer connection electrode 431, and a second interlayer connection portion 432. Moreover, the first interlayer connection electrode 461 may be connected to the connection line 440 via a via contact 457.

A protective layer 465 may be disposed on the third interlayer insulating layer 445. The protective layer 465 is formed to cover the source and drain electrodes 460. On the protective layer 465, a first planarization film 470 is disposed. The first planarization film 470 may have a sufficient thickness to planarize an upper surface having a step caused by the underlying circuit elements.

A first connection electrode 475 and a second connection electrode 480 are disposed on the first planarization film 470. Each of the first connection electrode 475 and the second connection electrode 480 may be connected to the connection line 440 and a conductive contact 477 disposed on the second interlayer insulating layer 435. The conductive contact 477 may include a conductive material or a metal material filling a contact-hole 476 extending through the first planarization film 470, the protective layer 465, and the third interlayer insulating layer 445. A top surface of each of the conductive contacts 477 may contact and be electrically connected to a bottom surface of each of the first connection electrode 475 and the second connection electrode 480, while a bottom surface thereof may contact and be electrically connected to an upper surface of each of the connection lines 440.

The light-emitting device ED1 may be disposed on the first connection electrode 475 and the second connection electrode 480. In this regard, the first connection electrode 475 may be electrically connected to the connection line 440. Moreover, the second connection electrode 480 may be electrically connected to the thin-film transistor TFT.

The light-emitting device ED1 may have a flip chip shape so that the first electrode 140 thereof faces (e.g., overlaps) the first connection electrode 475 of the package substrate P-SUB, and the second electrode 145 thereof faces (e.g., overlaps) the second connection electrode 480 of the package substrate P-SUB. The light-emitting device ED1 and the package substrate P-SUB may be bonded to each other via a conductive adhesive layer 481.

For example, the first electrode 140 and the second electrode 145 may be respectively attached to the first connection electrode 475 and the second connection electrode 480 via the conductive adhesive layer 481. In one embodiment, the conductive adhesive layer 481 is between the first electrode 140 and the first connection electrode 475 and between the second electrode 145 and the second connection electrode 480 as shown in FIG. 7. The first electrode 140 and the first connection electrode 475 are attached to each other via the conductive adhesive layer 481, and the second electrode 145 and the second connection electrode 480 are attached to each other via the conductive adhesive layer 481.

Each of the first electrode 140 and the second electrode 145 according to an embodiment of the present disclosure may made of the silicide alloy. For example, each of the first electrode 140 and the second electrode 145 may include titanium silicide ($TiSi_2$), cobalt silicide ($CoSi_2$) or nickel silicide ($NiSi_2$).

As the first electrode 140 and the second electrode 145 of the light-emitting device ED1 electrically connected to the package substrate P-SUB are made of the silicide alloy, a current injection amount may be increased compared to a case where each of the first electrode 140 and the second electrode 145 is made of a metal oxide. Accordingly, the luminous efficiency of the light-emitting device may be increased to reduce power consumption.

An exposed portion of the light-emitting device ED1 may be entirely covered with an insulating layer 483 and 485. The insulating layer 483 and 485 may be made of a positive-type photoactive compound (PAC). The insulating layer 483 and 485 may have a structure in which the first insulating layer 483 and the second insulating layer 485 are stacked.

A bank 487 having a bank hole 488 defined therein is disposed on the second insulating layer 485. The bank 487 may act as a boundary area defining a light-emitting area and plays a role in defining each sub-pixel. The bank 487 acts as a barrier to prevent light beams of different colors emitted from adjacent sub-pixels from being mixed with each other. In one example, the bank 487 may include a black matrix. Embodiments of the present disclosure are not limited thereto.

On the bank 487 having the bank hole 488 defined therein, a second planarization film 490 is disposed. That is, the second planarization film 490 is on the bank 487 and fills the bank hole 488 The second planarization film 490 serves to planarize an upper surface having a step caused by the bank 487 and the bank hole 488. In one example, the second planarization film 490 may include a positive-type photoactive compound (PAC).

A cover layer 495 may be disposed on the second planarization film 490. The cover layer 495 may include a functional optical film such as an anti-scattering film. In one example, the cover layer 495 may further include an optical clear adhesive (OCA) under the functional optical film. Embodiments of the present disclosure are not limited thereto.

In the display apparatus according to the embodiment of the present disclosure, the electrode of the light-emitting device may be made of the silicide alloy having a lower work function and lower resistance compared to metal oxide, thereby increasing the current injection amount into the light-emitting device, thereby increasing the luminous efficiency thereof, and thus reducing power consumption.

Figure 8:
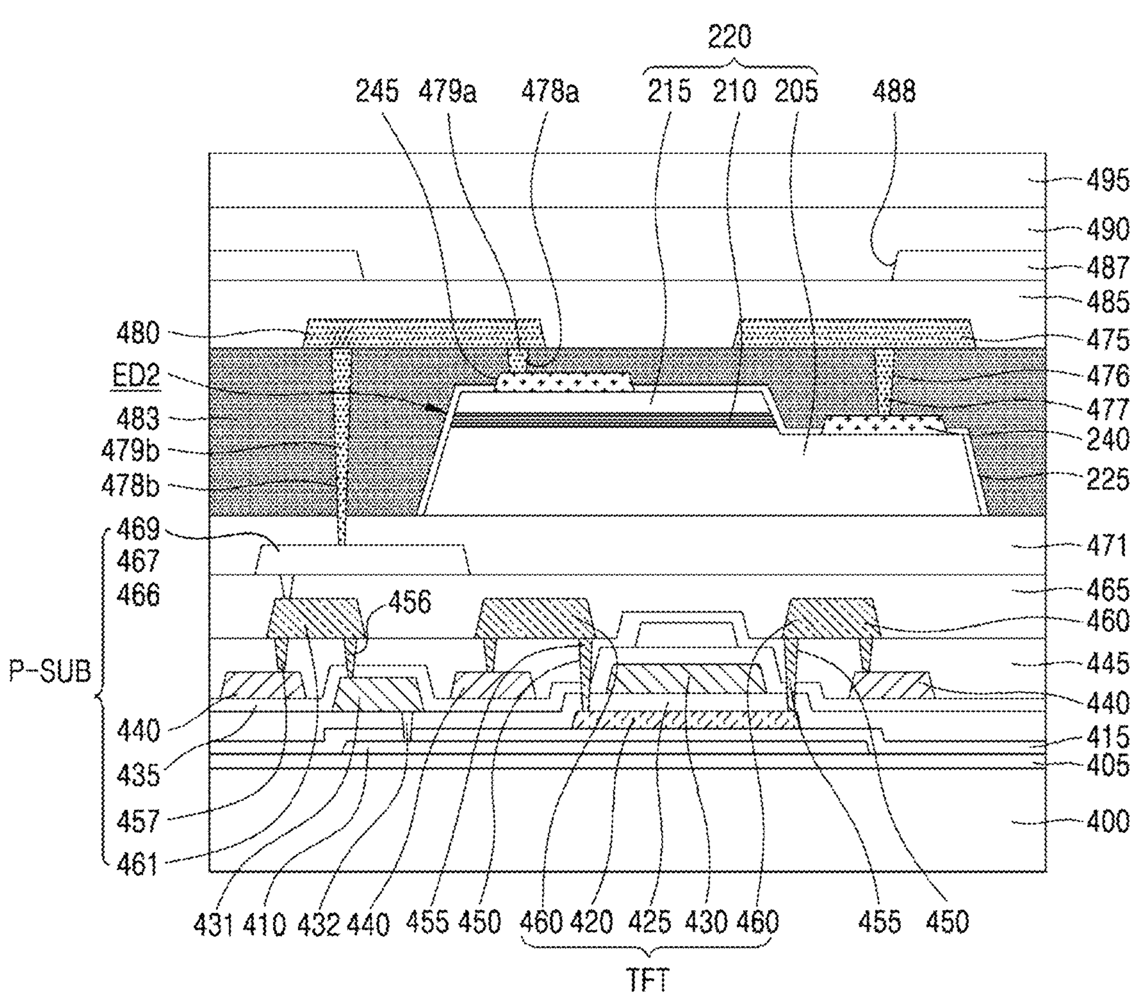
FIG. 8 is a diagram showing a display apparatus according to another embodiment of the present disclosure.

FIG. 8 is a diagram showing a display apparatus according to another embodiment of the present disclosure. In this regard, a light-emitting device as shown in FIG. 8 includes the same configuration as that of the light-emitting device ED2 according to the embodiment of the present disclosure described in FIG. 5. Accordingly, duplicate descriptions thereof are omitted.

Referring to FIG. 8, the display apparatus according to another embodiment of the present disclosure includes a configuration in which the light-emitting device ED2 is disposed on the package substrate P-SUB.

The light-emitting device ED2 may include the nitride semiconductor structure 220, the passivation pattern 225, the first electrode 240, and the second electrode 245. The nitride semiconductor structure 220 may include the first semiconductor layer 205, the active layer 210, and the second semiconductor layer 215. The active layer 210 and the second semiconductor layer 215 of the nitride semiconductor structure 220 are disposed on an upper surface of one side of the first semiconductor layer 205, while an upper surface of the other side opposite to one side may have a step as a portion of a surface of an upper portion of the first semiconductor layer 205 is exposed via mesa etching.

Each of the first electrode 240 and the second electrode 245 may include the silicide alloy. For example, each of the first electrode 240 and the second electrode 245 may include titanium silicide ($TiSi_2$), cobalt silicide ($CoSi_2$) or nickel silicide ($NiSi_2$).

A plurality of circuit elements for driving the light-emitting device ED2 are disposed in the package substrate P-SUB. For example, the light-emitting device ED2 may be disposed on the package substrate P-SUB. A thin-film transistor TFT may be disposed on the base substrate 400. The second interlayer insulating layer 435 and the third interlayer insulating layer 445 may be sequentially disposed on the gate electrode 430 of the thin-film transistor TFT.

The plurality of connection lines 440 may be disposed on the second interlayer insulating layer 435. The third interlayer insulating layer 445 may be disposed on the second interlayer insulating layer 435 and cover the plurality of connection lines 440. The protective layer 465 is disposed on the third interlayer insulating layer 445. The protective layer 465 is formed to cover the source and drain electrodes 460.

On the protective layer 465, a third interlayer connection electrode 469 is disposed. The third interlayer connection electrode 469 may be connected to the first interlayer connection electrode 461 via an interlayer connection contact 467. The first interlayer connection electrode 461 may be electrically connected to the light-blocking layer 410 via the first interlayer connection portion 456, the second interlayer connection electrode 431, and the second interlayer connection portion 432. The interlayer connection contact 467 may include a conductive material that fills an interlayer connection contact-hole 466 extending through the protective layer 465 so as to expose a portion of an upper surface of the first interlayer connection electrode 461.

An adhesive layer 471 covering the interlayer connection electrode 469 is disposed on the protective layer 465. The adhesive layer 471 may be a layer for bonding the light-emitting device ED2 to the package substrate P-SUB and may include an insulating material having adhesiveness.

The light-emitting device ED2 is disposed on the adhesive layer 471. The light-emitting device ED2 may be embodied as a micro-LED having a horizontal structure. However, the present disclosure is not limited thereto.

An exposed portion of the light-emitting device ED2 may be covered with the first insulating layer 483. The first insulating layer 483 may include a positive-type photoactive compound (PAC).

The first connection electrode 475 and the second connection electrode 480 are disposed on the first insulating layer 483 and are spaced apart from each other. The first connection electrode 475 is connected to the first electrode 240 of the light-emitting device ED2 via the first contact 477 filling the first contact-hole 476 extending through the first insulating layer 483. The second connection electrode 480 connects the second electrode 245 of the light-emitting device ED2 and the interlayer connection electrode 469 via connection portions 479*a* and 479*b*. The connection portions 479*a* and 479*b* may include the first connection portion 479*a* and the second connection portion 479*b*. The first connection portion 479*a* is disposed at one side of the second connection electrode 480 and extends through the first insulating layer 483 and is connected to the second electrode 245 of the light-emitting device ED2. The first connection portion 479*a* may include a conductive material that fills a first connection hole 478*a* which partially extends through the first insulating layer 483 so as to expose a surface of the second electrode 245.

The second connection portion 479*b* is disposed at the other side of the second connection electrode 480 opposite to the one side thereof at which the first connection portion 479*a* is disposed. The second connection portion 479*b* may extend through the first insulating layer 483 and extend through a portion of the adhesive layer 471 and may be connected to the interlayer connection electrode 469. The second connection portion 479*b* may include a conductive material that fills a second connection hole 478*b* which extends through the first insulating layer 483 and extends through a portion of the adhesive layer 471 so as to expose a portion of a surface of the interlayer connection electrode 469.

The second insulating layer 485 may be disposed on the first insulating layer 483, and on the first connection electrode 475 and the second connection electrode 480. The second insulating layer 485 may include a positive-type photoactive compound (PAC).

The bank 487 having a bank hole 488 defined therein is disposed on the second insulating layer 485. The bank 487 acts as a boundary area defining the light-emitting area and plays a role in defining each sub-pixel. Moreover, the bank 487 serves as a barrier to prevent the light beams of different colors emitted from adjacent pixels from being mixed with each other. In one example, the bank 487 may include a black matrix.

On the bank 487 having the bank hole 488 defined therein, the second planarization film 490 is disposed. The second planarization film 470 serves to planarize the upper surface with a step caused by the bank 487 and the bank hole 488. In one example, the second planarization film 490 may include a positive-type photoactive compound (PAC).

The cover layer 495 may be disposed on the second planarization film 490. The cover layer 495 may include a functional optical film such as an anti-scattering film.

Each of the first electrode 240 and the second electrode 245 according to another embodiment of the present disclosure may include the silicide alloy. As each of the first electrode 240 and the second electrode 245 of the light-emitting device ED2 electrically connected to the package substrate P-SUB is made of the silicide alloy, the current injection amount may be increased compared to that when each of the first electrode 240 and the second electrode 245 is made of a metal oxide. Accordingly, the luminous efficiency of the light-emitting device may be increased and thus the power consumption may be reduced, so that the product can operate at a low power level.

Figure 9:
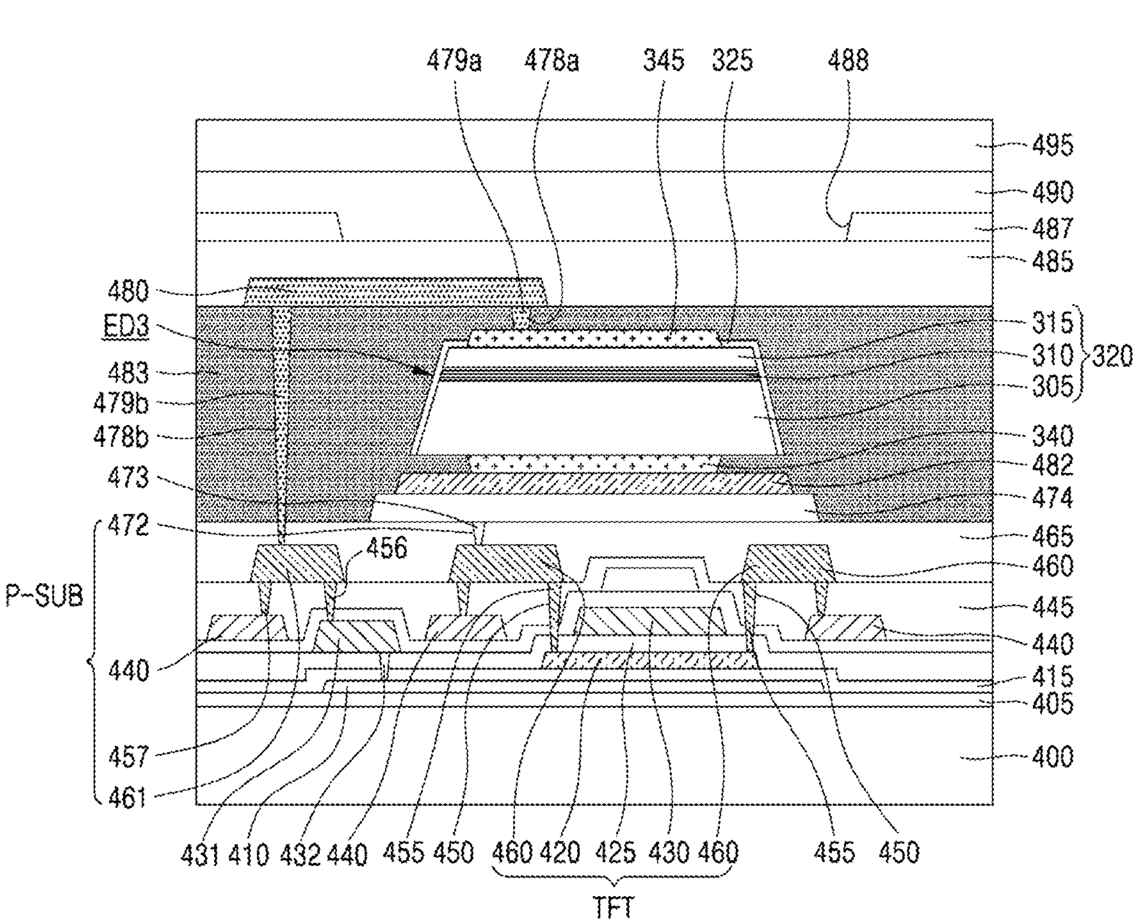
FIG. 9 is a diagram showing a display apparatus according to still another embodiment of the present disclosure.

FIG. 9 is a diagram showing a display apparatus according to still another embodiment of the present disclosure.

Referring to FIG. 9, the display apparatus according to still another embodiment of the present disclosure includes a configuration in which a light-emitting device is bonded onto the package substrate P-SUB. For example, the light-emitting device may be the light-emitting device ED3 according to another embodiment of the present disclosure.

Each of the first electrode 340 and the second electrode 345 of the light-emitting device ED3 may include a silicide alloy. For example, each of the first electrode 340 and the second electrode 345 may include titanium silicide ($TiSi_2$), cobalt silicide ($CoSi_2$) or nickel silicide ($NiSi_2$).

A plurality of circuit elements for driving the light-emitting device ED3 are disposed in the package substrate P-SUB. For example, the light-emitting device ED3 may be disposed on the package substrate P-SUB. A thin-film transistor TFT may be disposed on the base substrate 400. The second interlayer insulating layer 435 and the third interlayer insulating layer 445 may be sequentially disposed on the gate electrode 430 of the thin-film transistor TFT.

The plurality of connection lines 440 disposed on the second interlayer insulating layer 435 may be covered with the third interlayer insulating layer 445. A protective layer 465 is disposed on the third interlayer insulating layer 445.

The protective layer 465 is formed to cover the source and drain electrodes 460 of the thin-film transistor TFT.

On the protective layer 465, a first connection electrode 474 is disposed. The first connection electrode 474 may be electrically connected to one of the source and drain electrodes 460 of the thin-film transistor TFT via an interlayer connection contact 473. The interlayer connection contact 473 may include a conductive material that fills an interlayer connection contact-hole 472 which extends through the protective layer 465 so as to expose a portion of an upper surface of one of the source and drain electrodes 460.

An adhesive layer 482 is disposed on the first connection electrode 474. The adhesive layer 482 may be a layer for bonding the light-emitting device ED3 to the package substrate P-SUB, and may include a conductive material having adhesiveness.

The light-emitting device ED3 is disposed on the adhesive layer 482. The light-emitting device ED3 may be embodied as a micro-LED having a vertical structure. However, the present disclosure is not limited thereto.

A portion of the light-emitting device ED3 exposed to the outside may be covered with the first insulating layer 483. The first insulating layer 483 may include a positive-type photoactive compound (PAC).

The second connection electrode 480 is disposed on the first insulating layer 483. The second connection electrode 480 may connect the second electrode 345 of the light-emitting device ED3 to the light blocking layer 410 via the connection portions **479*a* and 479*b*. The connection portions 479*a* and 479*b* may include the first connection portion 479*a* and the second connection portion 479*b*. The first connection portion 479*a* is disposed at one side of the second connection electrode 480 and is connected to a portion of the second electrode 345 of the light-emitting device ED3 exposed to the outside by etching the first insulating layer 483. The first connection portion 479*a* may include a conductive material that fills the first connection hole 478*a* exposing a portion of a surface of the second electrode 345**.

The second connection portion **479*b* is disposed at the other side of the second connection electrode 480 opposite to the one side thereof at which the first connection portion 479*a* is disposed. The second connection portion 479*b* may extend through the first insulating layer 483 and be connected to the first interlayer connection electrode 461. The second connection portion 479*b* may include a conductive material that fills the second connection hole 478*b* which extends through the first insulating layer 483 so as to expose a portion of the surface of the first interlayer connection electrode 461. The first interlayer connection electrode 461 may be connected to the light-blocking layer 410 via the first interlayer connection portion 456, the second interlayer connection electrode 431, and the second interlayer connection portion 432**.

The second insulating layer 485 may be disposed on the first insulating layer 483 and on the second connection electrode 480 disposed on the first insulating layer 483. The second insulating layer 485 may include a positive-type photoactive compound (PAC).

The bank 487 having the bank hole 488 defined therein is disposed on the second insulating layer 485. In one example, the bank 487 may include a black matrix. Embodiments of the present disclosure are not limited thereto. On the bank 487, the second planarization film 490 is disposed. The second planarization film 490 may planarize the upper surface with a step caused by the bank 487 and the bank hole 488. In one example, the second planarization film 490 may include a positive-type photoactive compound (PAC).

The cover layer 495 may be disposed on the second planarization film 490. The cover layer 495 may include a functional optical film such as an anti-scattering film.

Figure 10:
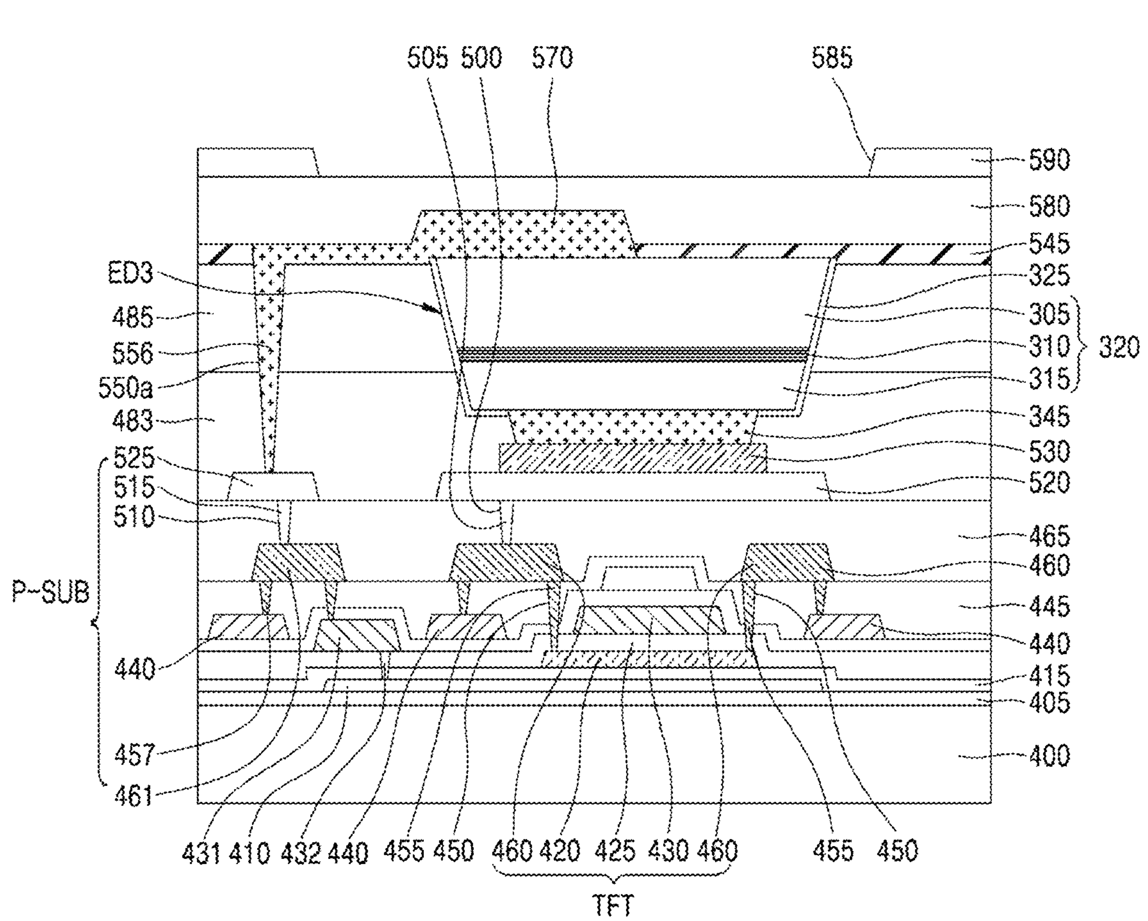
FIG. 10 is a diagram showing a display apparatus according to still yet another embodiment of the present disclosure.

FIG. 10 is a diagram showing a display apparatus according to still yet another embodiment of the present disclosure.

In FIG. 10, the second electrode 345 of the light-emitting device ED3 of FIG. 9 is disposed so as to face the first connection electrode 520 disposed on the package substrate P-SUB. The second electrode 345 and the first connection electrode 520 are bonded to each other via an adhesive layer 530. Accordingly, redundant descriptions of the same components as those FIG. 9 are omitted. Differences therebetween will be described.

In one example, the second electrode 345 in contact with the second semiconductor layer 315 of the light-emitting device ED3 may be bonded to the adhesive layer 530 including a conductive material, and thus may be connected to the first connection electrode 520 and may be connected to one of the source and drain electrodes 460 of the thin-film transistor TFT via an interlayer connection contact 505. The interlayer connection contact 505 may be made of a conductive material that fills an interlayer connection contact-hole 500 formed by etching the protective layer 465 so as to expose a portion of the upper surface of one of the source and drain electrodes 460.

A first electrode 570 of the light-emitting device ED3 may be in contact with a rear surface of the first semiconductor layer 305, and may extend on the second insulating layer 485 in one direction. A through-electrode 556 that extends from the first electrode 570 fills a first pattern opening 550*a* which extends through the first and second insulating layers 483 and 485 so as to expose a portion of an upper surface of a second connection electrode 525 of the package substrate P-SUB. The second connection electrode 525 and the first connection electrode 520 may be disposed on the protective layer 465 and thus may be coplanar with each other.

The second connection electrode 525 may be electrically connected to the first interlayer connection electrode 461 via an interlayer connection contact 515. The first interlayer connection electrode 461 may be connected to the light-blocking layer 410 via the first interlayer connection portion 456, the second interlayer connection electrode 431, and the second interlayer connection portion 432.

In this regard, each of the first electrode 570 in contact with the rear surface of the first semiconductor layer 305, the through-electrode 556, and the second electrode 345 in contact with the second semiconductor layer 315 may include a silicide alloy. For example, the first electrode 570, the through-electrode 556, and the second electrode 345 may include titanium silicide ($TiSi_2$), cobalt silicide ($CoSi_2$) or nickel silicide ($NiSi_2$).

Hereinafter, a method for manufacturing a light-emitting device according to an embodiment of the present disclosure will be described.

FIG. 11 to FIG. 17 are views for illustrating a method for manufacturing a light-emitting device according to an embodiment of the present disclosure.

Figure 11:
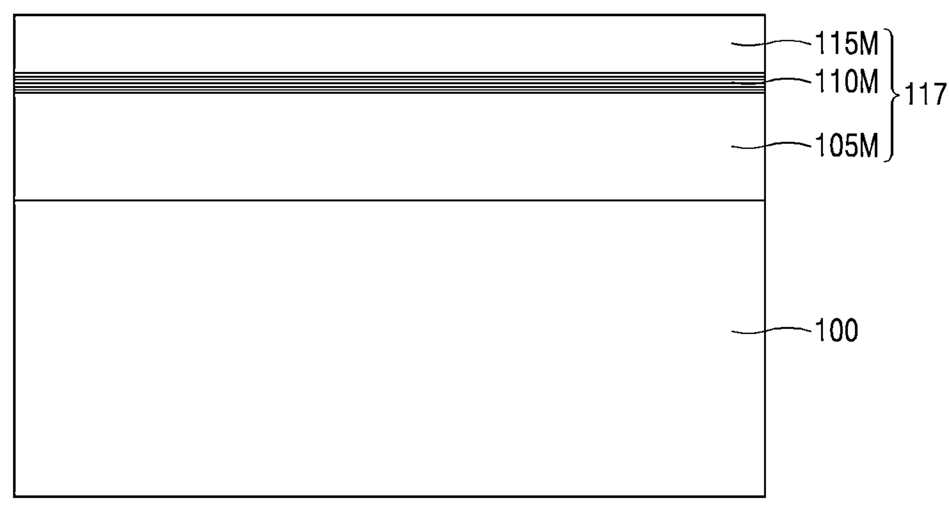
FIG. 11 to FIG. 17 are views for illustrating a method for manufacturing a light-emitting device according to an embodiment of the present disclosure.

Referring to FIG. 11, a nitride semiconductor layer 117 including a first semiconductor material layer 105M, an active material layer 110M, and a second semiconductor material layer 115M is grown on the growth substrate 100. The nitride semiconductor layer 117 may be grown in an epitaxy process. The epitaxy process may be understood as a process of growing a layer in a specific orientation relationship on a surface of a certain crystal.

The first semiconductor material layer 105M may be made of a gallium nitride (GaN)-based semiconductor material as a nitride semiconductor. The first semiconductor material layer 105M may include a nitride semiconductor containing first conductivity type impurities. For example, the first conductivity-type impurity may include an N-type impurity. The nitride semiconductor may be, for example, a gallium nitride (GaN)-based semiconductor material such as gallium nitride (GaN), aluminum gallium nitride (AlGaN), indium gallium nitride (InGaN), or aluminum indium gallium nitride (AlInGaN). For example, the N-type impurity doped into the first semiconductor material layer 105M may include silicon (Si), germanium (Ge), selenium (Se), tellurium (Te), or Carbon©. Embodiments of the present disclosure are not limited thereto.

The active material layer 110M is disposed on top of the first semiconductor material layer 105M. The active material layer 110M is a layer for emitting light based on recombination of electrons and holes. The active material layer 110M includes a multi-quantum well (MQW) structure having a well layer and a barrier layer having a higher band gap than that of the well layer. For example, the active material layer 110M may include an indium gallium nitride (InGaN) layer as a well layer, and an aluminum indium gallium nitride (AlGaN) layer as a barrier layer. However, the materials are not limited thereto.

The second semiconductor material layer 115M is formed on the active material layer 110M. The second semiconductor material layer 115M may include a nitride semiconductor containing a second conductivity type impurity. For example, the second conductivity type impurity may include a P-type impurity. The nitride semiconductor may be a gallium nitride (GaN)-based semiconductor material including gallium nitride (GaN), aluminum indium gallium nitride (AlGaN), indium gallium nitride (InGaN), or aluminum indium gallium nitride (AlInGaN). The P-type impurity doped into the second semiconductor material layer 115M may include manganese (Mg), zinc (Zn), or beryllium (Be). In the present disclosure, an example in which the first semiconductor material layer 105M and the second semiconductor material layer 115M are made of the nitride semiconductor containing the N-type impurities and the nitride semiconductor containing the P-type impurities, respectively, is described. However, the present disclosure is not limited thereto. In one example, the first semiconductor material layer 105M and the second semiconductor material layer 115M may be made of a nitride semiconductor containing the P-type impurities and a nitride semiconductor containing the N-type impurities, respectively.

Figure 12:
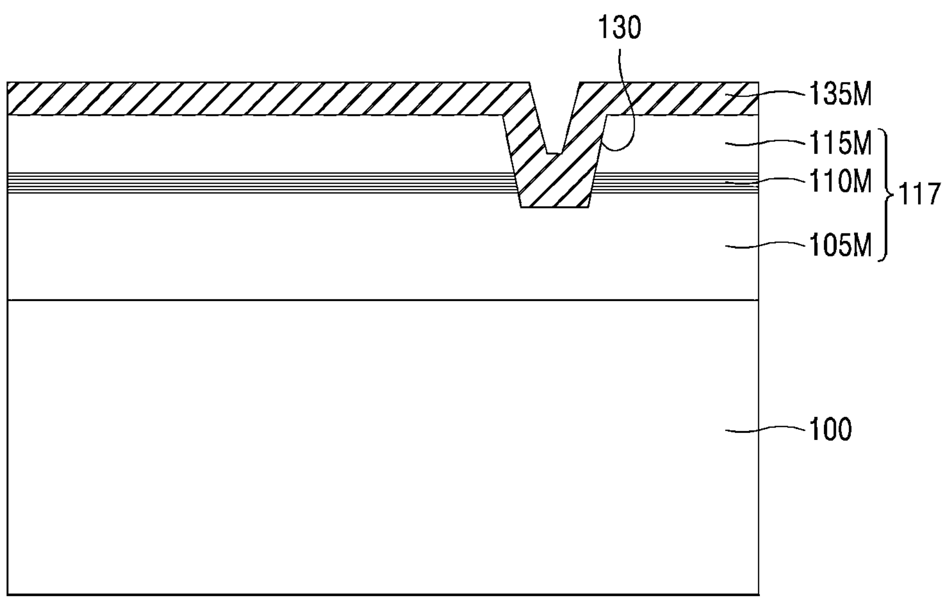

Referring to FIG. 12, the trench hole 130 is formed in the nitride semiconductor layer 117. The trench hole 130 may be formed by performing an etching process. The trench hole 130 may be formed in one side of the nitride semiconductor layer 117. The trench hole 130 may extend through the second semiconductor material layer 115M as a topmost layer of the nitride semiconductor layer 117 and the active material layer 110M and partially extend through the first semiconductor material layer 105M such that a bottom surface thereof is positioned in the first semiconductor material layer 105M. A portion of the surface of the first semiconductor material layer 105M may be exposed through the bottom surface of the trench hole 130.

Subsequently, a silicide reaction material layer 135M is formed along and on the trench hole 130 and on a top surface of the second semiconductor material layer 115M. The silicide reaction material layer 135M includes a material capable of inducing a metal silicide reaction thereafter, and may include, for example, silicon (Si). The silicide reaction material layer 135M may be formed along a side wall and the bottom surface of the trench hole 130.

Figure 13:
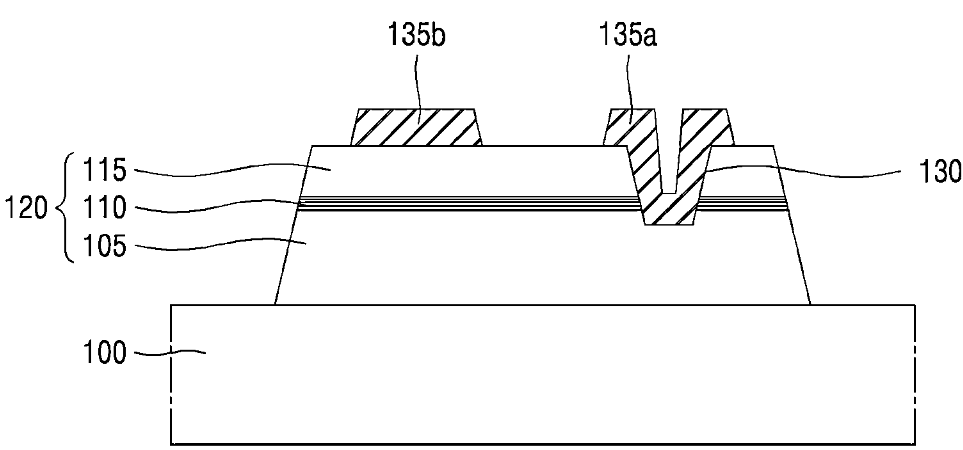

Referring to FIG. 13, the nitride semiconductor layer 117 including the silicide reaction material layer 135M is patterned to form the nitride semiconductor structure 120, a silicide reaction pattern 135*a* (e.g., a first silicide reaction pattern) and a silicide reaction pattern 135*b* (e.g., a second silicide reaction pattern). The silicide reaction pattern 135*a* is formed on a first side of the nitride semiconductor structure 120 and the silicide reaction pattern 135*b* is formed on a second side of the nitride semiconductor structure 120. To this end, the nitride semiconductor structure 120 is first formed through a first patterning process using an etching mask. The first patterning process may be performed in a dry etching scheme. The dry etching scheme may be carried out using an inductively coupled plasma-reactive ion etch (ICP-RIE) using a reactive gas. The patterning process may proceed until a surface of the growth substrate 100 is exposed. Then, adjacent nitride semiconductor structures 120 may be separated from each other. One nitride semiconductor structure 120 is shown for convenience of illustration in the drawing. However, the present disclosure is not limited thereto. For example, a plurality of nitride semiconductor structures 120 may be spaced apart from each other while being disposed on the growth substrate 100.

Subsequently, the silicide reaction material layer 135M is etched through a second patterning process to form the silicide reaction patterns 135*a* and 135*b*. The silicide reaction patterns 135*a* and 135*b* may include the first silicide reaction pattern 135*a* and the second silicide reaction pattern 135*b*.

The first silicide reaction pattern 135*a* may be formed on an exposed bottom surface and an exposed sidewall of the trench hole 130 and may contact the first semiconductor layer 105. A portion of the first silicide reaction pattern 135*a* may be formed on and extend along an upper surface of the second semiconductor layer 115. The second silicide reaction pattern 135*b* may be disposed on and contact the second semiconductor layer 115. The first silicide reaction pattern 135*a* and the second silicide reaction pattern 135*b* may be spaced apart from each other and may be respectively disposed at both opposing sides of the nitride semiconductor structure 120.

Figure 14:
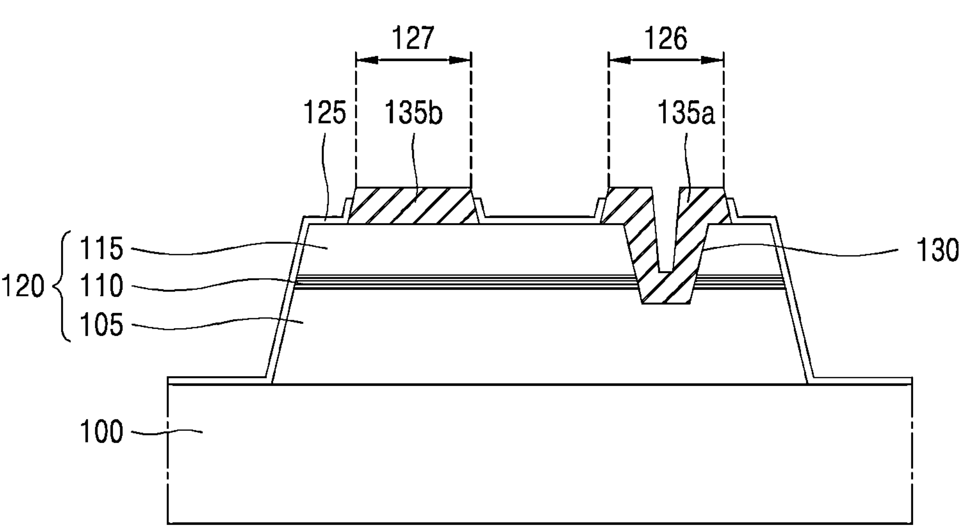

Referring to FIG. 14, the passivation pattern 125 is formed on the nitride semiconductor structure 120. The passivation pattern 125 may include an insulating material. In one example, the passivation pattern 125 may be made of silicon oxide (SiOx). However, the present disclosure is not limited thereto, a material having insulating properties may be used as a material thereof.

The passivation pattern 125 may cover an outer surface of the nitride semiconductor structure 120. The passivation pattern 125 may extend so as to cover a sidewall of each of the first silicide reaction pattern 135*a* and the second silicide reaction pattern 135*b* by a predetermined height without covering an upper surface of the first silicide reaction pattern 135*a* and an upper surface of the second silicide reaction pattern 135*b*. The passivation pattern 125 may include the first open area 126 exposing a portion of a surface of the first silicide reaction pattern 135*a* and a second open area 127 exposing a portion of a surface of the second silicide reaction pattern 135*b*.

Figure 15:
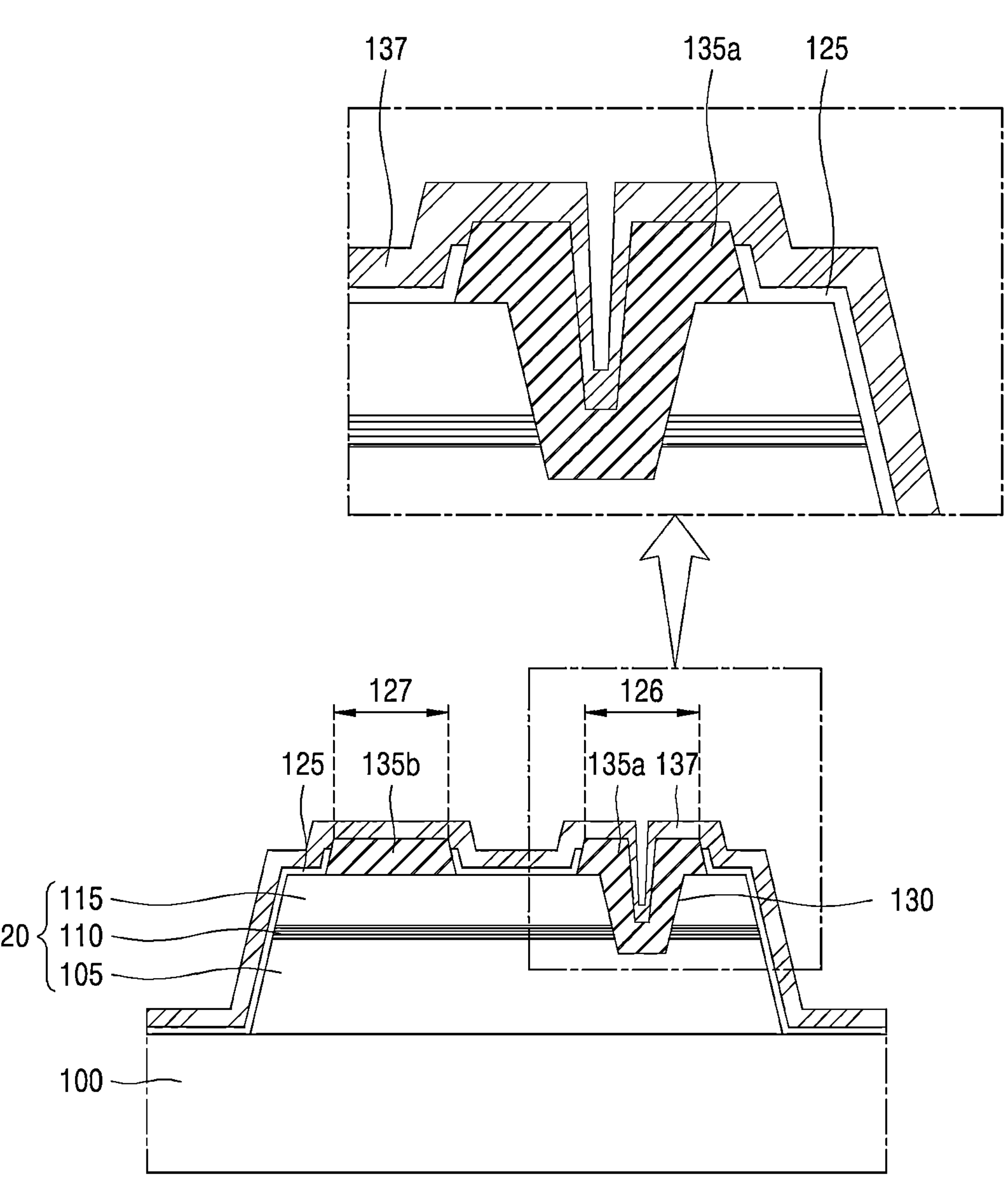

Referring to FIG. 15, a metal film 137 for silicide is formed on the growth substrate 100. The metal film 137 for silicide may be formed along an outer profile of the nitride semiconductor structure 120 covered with the passivation pattern 125. For example, the metal film 137 for silicide may be formed on an outer surface of the passivation pattern 125. The metal film 137 for silicide may contact an exposed surface of the first silicide reaction pattern 135*a* and an exposed surface of the second silicide reaction pattern 135*b* respectively exposed through the first open area 126 and the second open area 127. The metal film 137 for silicide may include titanium (Ti), cobalt (Co) or nickel (Ni).

Figure 16:
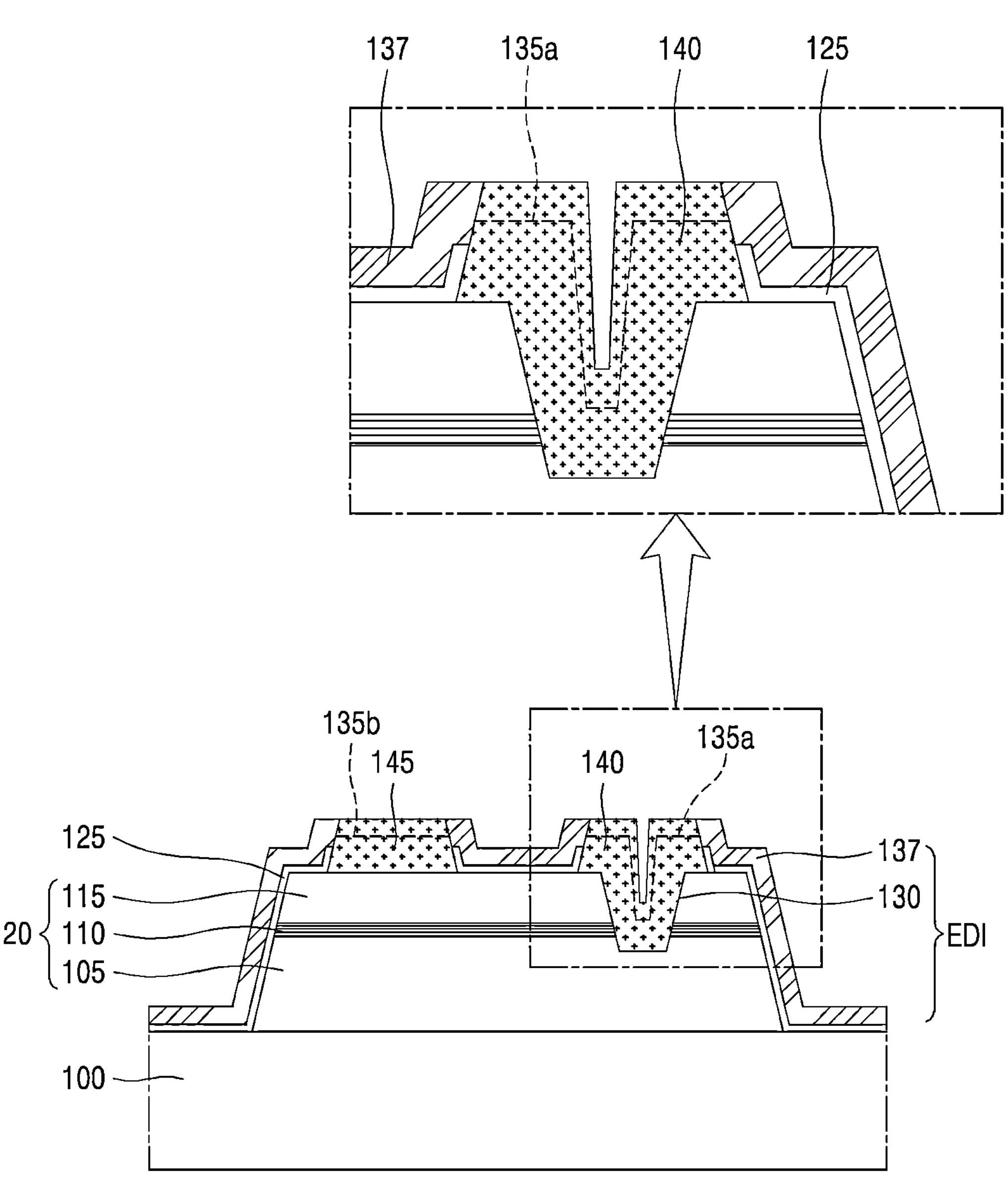

As shown in FIG. 16, the first silicide reaction pattern 135*a* and the second silicide reaction pattern 135*b* in contact with the metal film 137 for silicide may be converted to the first electrode 140 and the second electrode 145 under the heat applied in a process of depositing the metal film 137 for silicide. In this regard, as the passivation pattern 125 is made of the silicon oxide, a portion of the metal film 137 for the silicide in contact with the passivation pattern 125 may not be converted to the silicide alloy.

Accordingly, a portion of the metal film 137 for silicide not in contact with the passivation pattern 125 but in contact with the first silicide reaction pattern 135*a* and the second silicide reaction pattern 135*b* may be selectively converted to the silicide alloy. Thus, the first electrode 140 and the second electrode 145 may be self-aligned with each other.

Each of the first electrode 140 and the second electrode 145 may include the silicide alloy. For example, each of the first electrode 140 and the second electrode 145 may include titanium silicide ($TiSi_2$), cobalt silicide ($CoSi_2$) or nickel silicide ($NiSi_2$).

As each of the first electrode 140 and the second electrode 145 is composed of the silicide alloy with a low work function and low resistance compared to metal oxide, the current injection amount into the light-emitting device ED1 may be increased, which may increase the luminous efficiency and reduce power consumption.

In another embodiment, a metal silicide film may be formed by applying thermal energy to the metal film 137 for silicide in an annealing scheme. When the thermal energy is applied thereto in the annealing scheme, a metal element in the metal film 137 for silicide may diffuse into the first silicide reaction pattern 135*a* and the second silicide reaction pattern 135*b* that are in contact with the metal film 137 for silicide and may bind to silicon atoms constituting a lattice. In this regard, since the silicon lattice is composed of a single crystal, it is easy for the metal atoms to diffuse into the first silicide reaction pattern 135*a* and the second silicide reaction pattern 135*b*. In addition, the metal and the silicon may bind to each other such that the first silicide reaction pattern 135*a* and the second silicide reaction pattern 135*b* may be made of the silicide alloy.

The first silicide reaction pattern 135*a* and the second silicide reaction pattern 135*b* in contact with the metal film 137 for silicide may be converted to the silicide alloy. In this regard, the portion of the metal film 137 for the silicide in contact with the passivation pattern 125 may not be converted to the silicide alloy.

Figure 17:
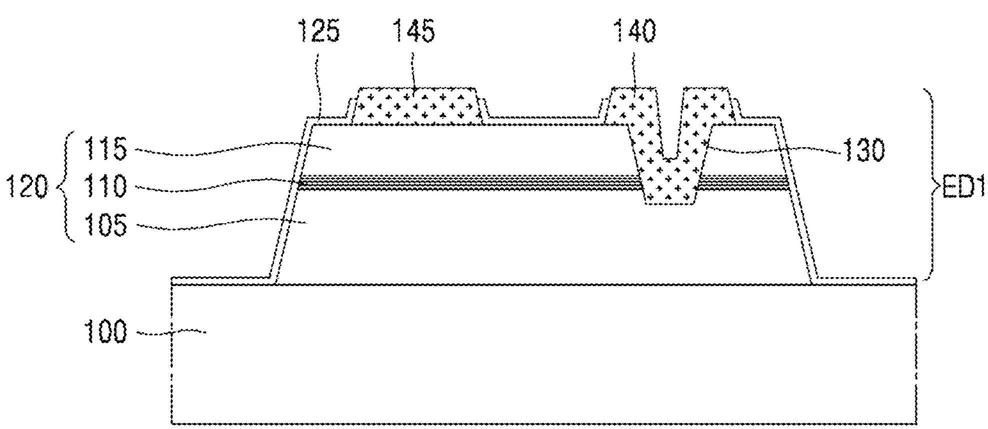

Referring to FIG. 17, the portion of the metal film 137 for silicide that has not been converted to the silicide alloy may be removed such that the light-emitting device ED1 may be formed. The portion of the metal film 137 for silicide that has not been converted to the silicide alloy may be removed in a wet etching scheme. A wet etching solution may selectively remove the portion of the metal film 137 for silicide contacting the passivation pattern 125 where no silicide reaction occurs. In this regard, the light-emitting device ED1 may be understood as a remaining portion except for the growth substrate 100.

According to an embodiment of the present disclosure, the first electrode 140 and the second electrode 145 may be formed under the silicide reaction without performing an exposure process. Accordingly, the exposure process step may be omitted, such that a total number of the process steps may be reduced, thereby optimizing the process.

Moreover, the first electrode 140 and the second electrode 145 may be formed in a saliside (Self-Aligned Silicide) process using a self-alignment scheme, thereby preventing a defect in which the device fails to emit light due to a defect such as misalignment of the electrodes from occurring. Moreover, the first electrode 140 and the second electrode 145 may be formed without the exposure process. Thus, an additional margin may be secured when transferring the light-emitting device to a panel substrate. Accordingly, a separate exposure process may be absent, thereby securing a margin when transferring the light-emitting device to the panel substrate.

The exposure process for forming the electrode of the light-emitting device may be omitted, thereby reducing the total number of the process steps and thus optimizing the process. In addition, since the exposure process for forming the electrode of the light-emitting device may be omitted, the defect during an exposure process in a process of forming the electrode of the light-emitting device due to the bowing phenomenon of the growth substrate may be removed.

FIG. 18 to FIG. 25 are diagrams for illustrating a method for manufacturing a display apparatus in which a light-emitting device according to an embodiment of the present disclosure is disposed.

Figure 18:
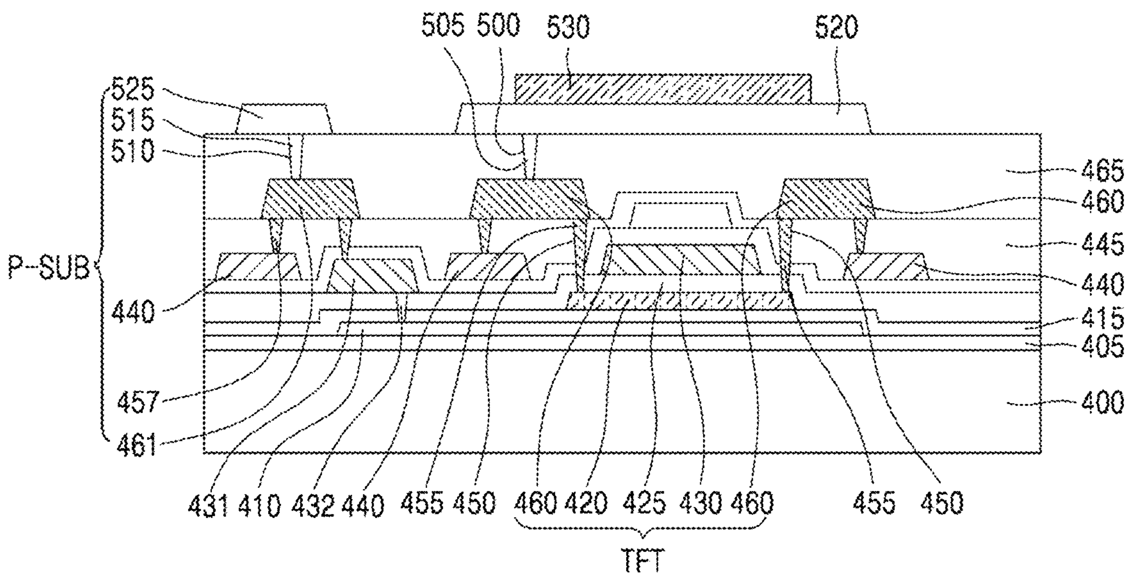
FIG. 18 to FIG. 25 are views for illustrating a method for manufacturing a display apparatus in which a light-emitting device according to an embodiment of the present disclosure is disposed.

Referring to FIG. 18, the package substrate P-SUB in which a plurality of circuit elements for driving the light-emitting device are disposed is prepared.

The thin-film transistor TFT may be disposed on the base substrate 400 of the package substrate P-SUB. The second interlayer insulating layer 435 and the third interlayer insulating layer 445 may be sequentially disposed on the gate electrode 430 of the thin-film transistor TFT.

The plurality of connection lines 440 disposed on the second interlayer insulating layer 435 may be covered with the third interlayer insulating layer 445. The protective layer 465 is disposed on the third interlayer insulating layer 445. The first connection electrode 520 may be formed on the protective layer 465. The first connection electrode 520 may be electrically connected to one of the source and drain electrodes 460 via the interlayer connection contact 505.

The second connection electrode 525 and the first connection electrode 520 may be spaced apart from each other and may be coplanar with each other. The second connection electrode 525 may be electrically connected to the first interlayer connection electrode 461 via the interlayer connection contact 515. The first interlayer connection electrode 461 may be connected to the light-blocking layer 410 via the first interlayer connection portion 456, the second interlayer connection electrode 431, and the second interlayer connection portion 432.

Figure 19:
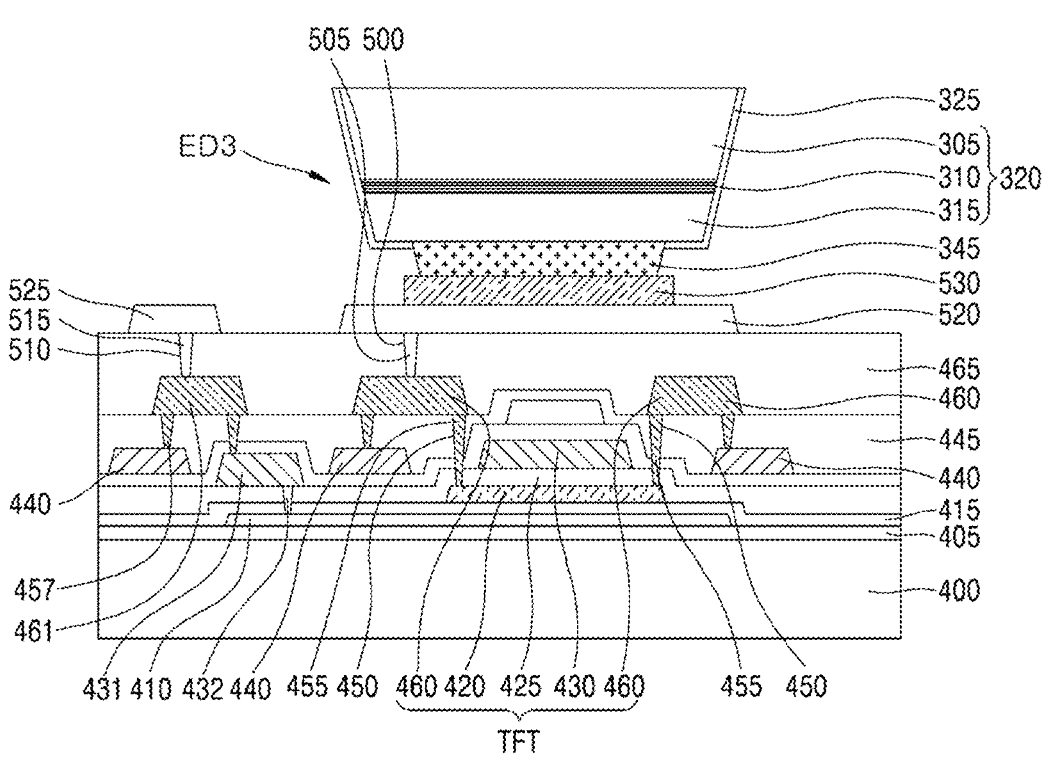

Referring to FIG. 19, the light-emitting device ED3 is placed. The light-emitting device ED3 according to an embodiment of the present disclosure may be placed. In this regard, the light-emitting device ED3 may have a structure in which the second electrode 345 connected to the second semiconductor layer 315 is formed. The second electrode 345 of the light-emitting device ED3 may be bonded to the first connection electrode 520 via the adhesive layer 530. Thus, a rear surface of the first semiconductor layer 305 of the light-emitting device ED3 may be exposed. In this regard, the exposed rear surface of the first semiconductor layer 305 of the light-emitting device ED3 may be opposite to an upper surface thereof on which the active layer 310 is disposed.

The second electrode 345 may include titanium silicide ($TiSi_2$), cobalt silicide ($CoSi_2$) or nickel silicide ($NiSi_2$).

The second electrode 345 may be formed using the saliside process as above-described in forming the first electrode 340 and the second electrode 345 of the light-emitting device ED3 according to an embodiment of the present disclosure.

The second electrode 345 of the light-emitting device ED3 may be in contact with the adhesive layer 530 including a conductive material.

Figure 20:
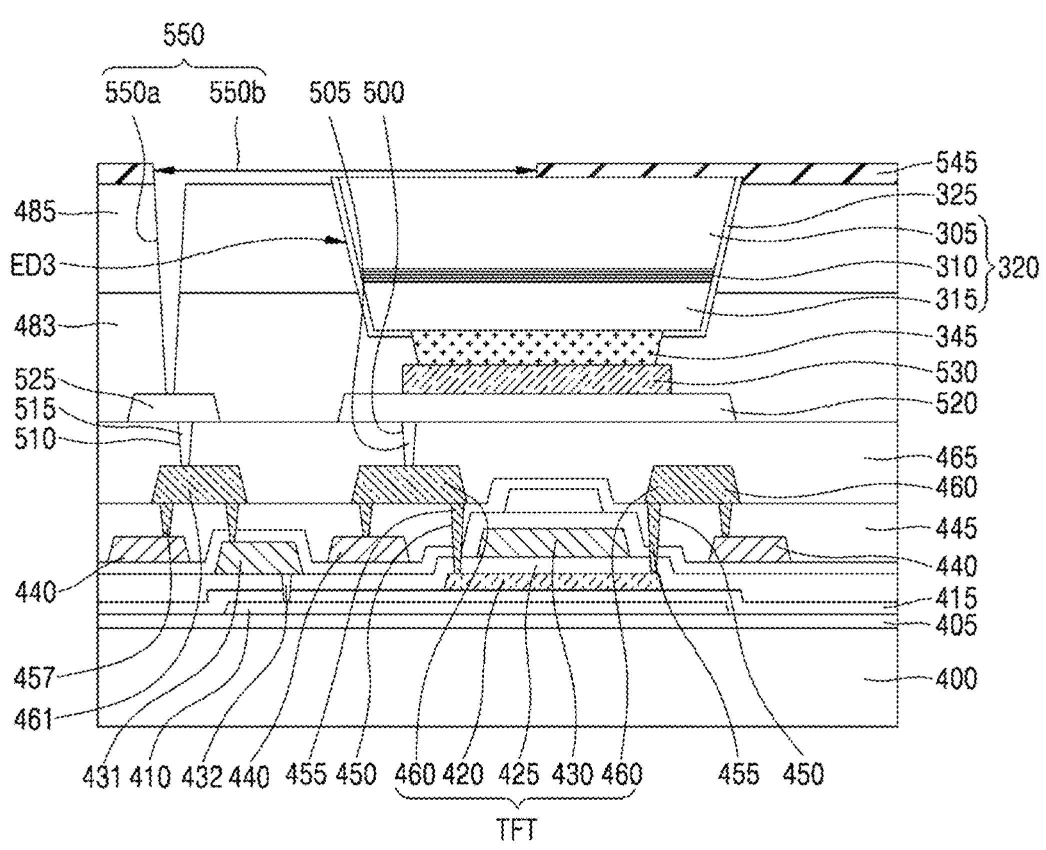

Referring to FIG. 20, the insulating layer 483 and 485 is formed on the light-emitting device ED3. The insulating layer 483 and 485 may include a positive-type photoactive compound (PAC). The insulating layer 483 and 485 may have a structure in which the first insulating layer 483 and the second insulating layer 485 are stacked. Subsequently, a barrier layer is formed on the second insulating layer 485. The barrier layer may be formed to cover the rear surface of the first semiconductor layer 305 of the light-emitting device ED3. The barrier layer includes a material that does not react with a metal material, and may be made of, for example, silicon oxide ($SiO_2$).

Next, the barrier layer is patterned to form a barrier pattern 545 including an open area defining an area where the first electrode is to be formed. The barrier pattern 545 may include a first pattern opening **550*a* and a second pattern opening 550*b*. The first pattern opening 550*a* extends through the first insulating layer 483 and the second insulating layer 485 so as to expose a portion of an upper surface of the second connection electrode 525. The second pattern opening 550*b* exposes a portion of the rear surface of the first semiconductor layer 305**.

Figure 21:
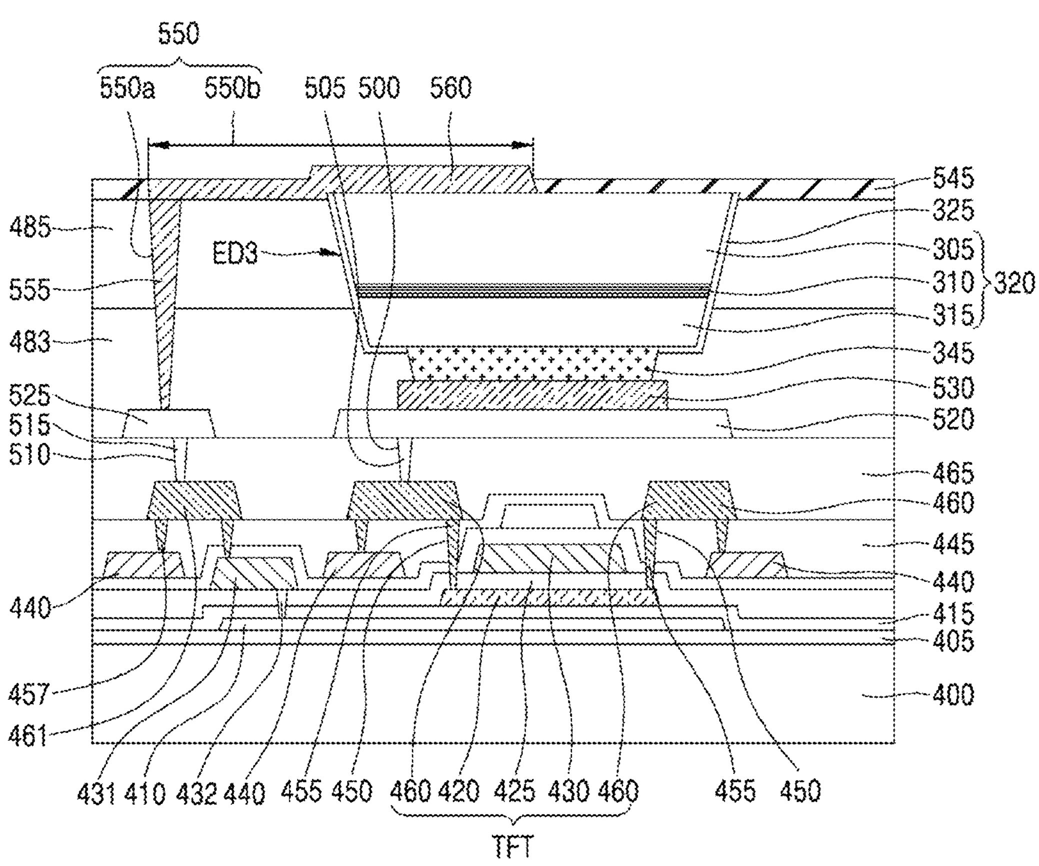

Referring to FIG. 21, silicide reaction material layers 555 and 560 are formed in the first pattern opening **550*a* and the second pattern opening 550*b* of the barrier pattern 545. The silicide reaction material layers 555 and 560 may include a material capable of inducing a silicide reaction later, and may include, for example, silicon (Si). The silicide reaction material layers 555 and 560 may be formed so as to fill the first pattern opening 550*a* and the second pattern opening 550*b***.

Figure 22:
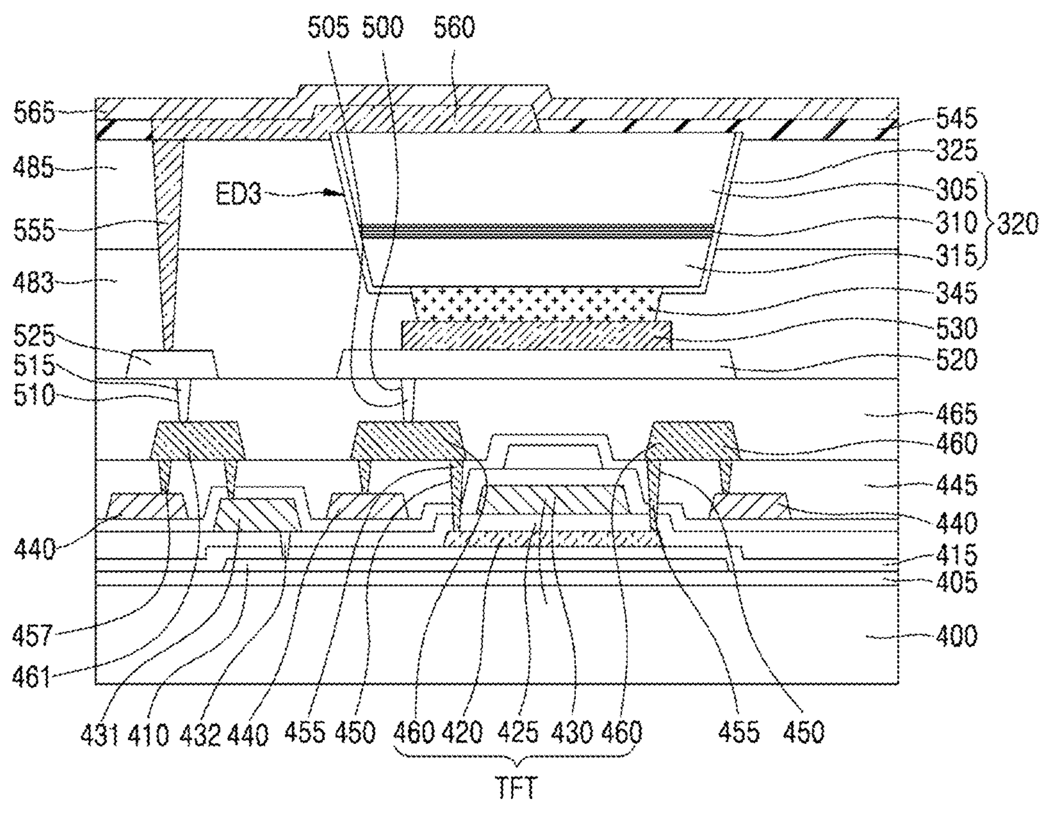
Figure 23:
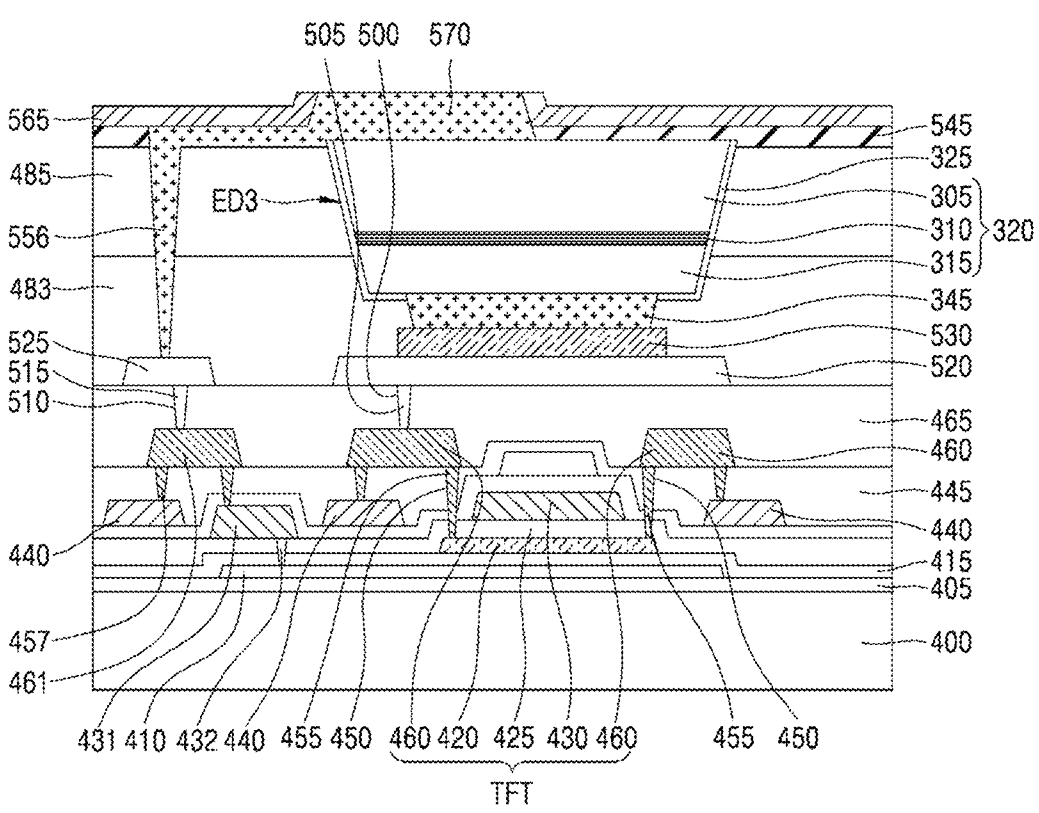

Referring to FIG. 22 and FIG. 23, a metal film 565 for silicide is formed on the barrier pattern 545 and on the silicide reaction material layers 555 and 560. The metal film 565 for silicide may come into contact with exposed surfaces of the silicide reaction material layers 555 and 560. The metal film 565 for silicide may include titanium (Ti), cobalt (Co) or nickel (Ni).

Next, the silicide reaction material layers 555 and 560 in contact with the metal film 565 for silicide may be converted to the first electrode 570 including a silicide alloy under the silicide reaction due to the heat applied when depositing the metal film 565 for silicide, as shown in FIG. 23.

When depositing metal film 565 for silicide, the heat may be applied to the silicide reaction material layers 555 and 560 in contact with the metal film 565 for silicide. Thus, the metal elements in the metal film 565 for silicide may diffuse into the silicide reaction material layers 555 and 560 that are in contact with the metal film 565 for silicide, and then may bind to the silicon atoms constituting the lattice in the silicide reaction material layers 555 and 560. In this regard, since the silicon lattice is composed of a single crystal, it is easy for the metal atoms to diffuse into the silicide reaction material layers 555 and 560. The metal and silicon bind to each other such that the silicide reaction material layers 555 and 560 may be converted to the silicide alloy. In this manner, the first electrode 570 and the through-electrode 556 may be formed.

First, in order that the second electrode connected to the second semiconductor layer of the light-emitting device of the vertical structure is formed, and then the first electrode in contact with the first semiconductor layer is formed, the light-emitting device is moved to a temporary substrate, and the first electrode is formed on the temporary substrate using an exposure process and then, the light-emitting device is transferred to the package substrate. In this case, however, a defect such as loss of the light-emitting device may occur in the process of moving the light-emitting device to the temporary substrate.

Moreover, in order to form the first electrode after transferring the light-emitting device to the temporary substrate, additional process steps such as the exposure process are required. Thus, a time and a cost may be further required for finally manufacturing the light-emitting device.

To the contrary, according to an embodiment of the present disclosure, the first electrode 570 connected to the rear surface of the first semiconductor layer 305 and the through-electrode 556 may be formed together in a single saliside process. Thus, the process may be simplified. Moreover, since the process of moving the light-emitting device to the temporary substrate may be omitted, the occurrence of defects such as loss of the light-emitting device may be prevented.

In another embodiment, the electrode may be formed by applying thermal energy to the metal film 565 for silicide in an annealing scheme.

The silicide reaction material layers 555 and 560 in contact with the metal film 565 for silicide may be converted to the silicide alloy. In this regard, the barrier pattern 545 may not be converted to the silicide alloy because the barrier pattern 545 incudes a material that does not react with the metal material of the metal film 565 for silicide.

Figure 24:
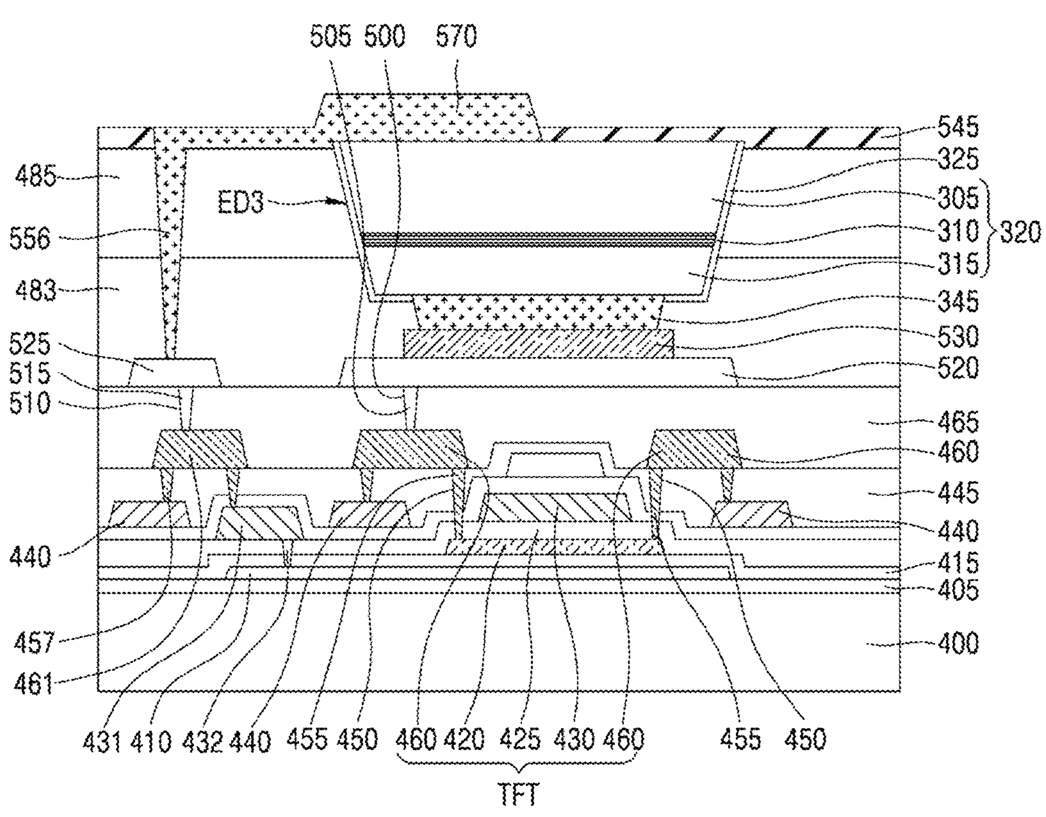

Referring to FIG. 24, the portion of the metal film 565 for silicide that has not been converted to the silicide alloy may be removed. The portion of the metal film 565 for silicide that has not been converted to the silicide alloy may be removed in a wet etching scheme.

Figure 25:
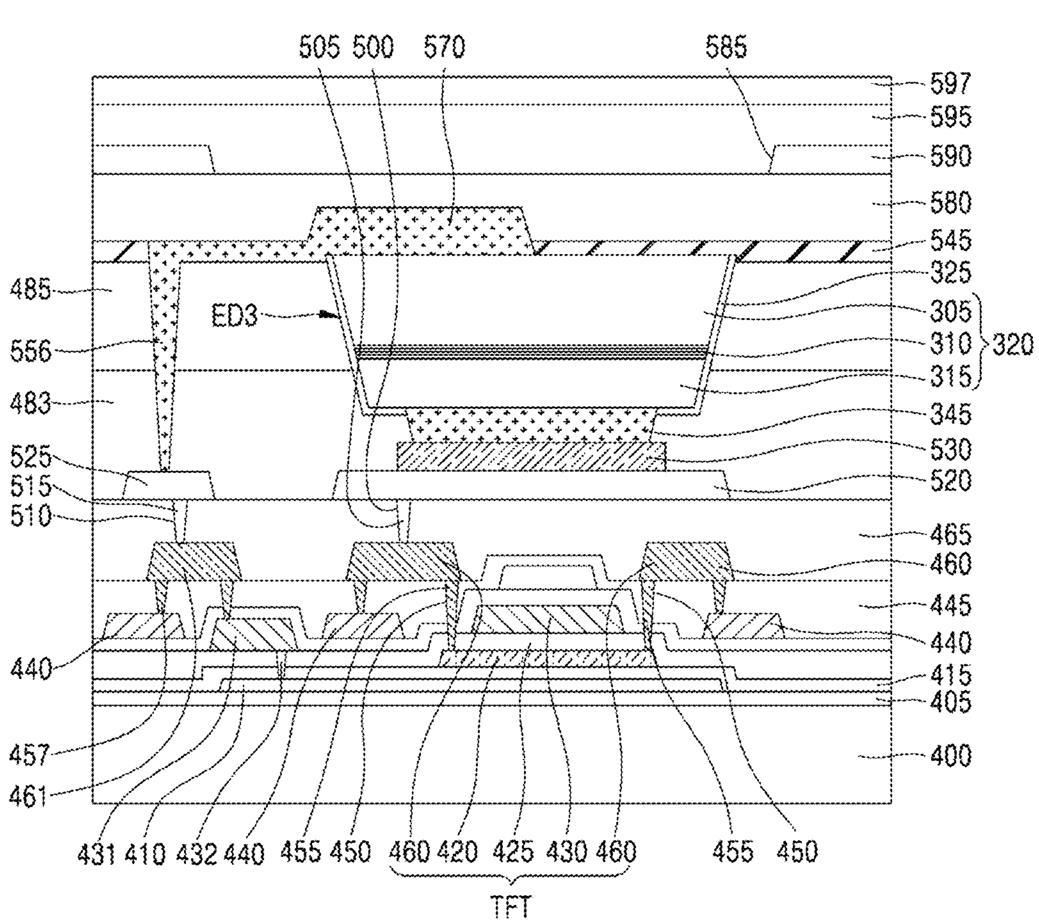

Referring to FIG. 25, the second insulating layer 580 is formed on the second electrode 570 including the silicide alloy and the barrier pattern 545. The insulating layer 580 may include a positive-type photoactive compound (PAC).

The bank 590 having the bank hole 585 defined therein is disposed on the second insulating layer 580. In one example, the bank 590 may include a black matrix. Embodiments of the present disclosure are not limited thereto.

On the bank 590 having the bank hole 585 defined therein, the second planarization film 595 is disposed. The second planarization film 595 serves to planarize the upper surface with the step caused by the bank 590 and the bank hole 585. In one example, the second planarization film 595 may include a positive-type photoactive compound (PAC).

The cover layer 597 may be disposed on the second planarization film 595. The cover layer 597 may include a functional optical film such as an anti-scattering film.

A first aspect of the present disclosure provides a light-emitting device comprising: a nitride semiconductor structure including a first semiconductor layer, an active layer and a second semiconductor layer; a passivation pattern disposed on an outer surface of the nitride semiconductor structure; a first electrode connected to the first semiconductor layer; and a second electrode spaced apart from the first electrode and connected to the second semiconductor layer, wherein each of the first electrode and the second electrode includes a silicide alloy.

In one implementation of the light-emitting device, the light-emitting device further comprises a trench hole defined in one side of the nitride semiconductor structure so as to expose a portion of a surface of the first semiconductor layer, wherein the first electrode fills the trench hole so as to be connected to the first semiconductor layer, and wherein an upper portion of the first electrode is coplanar with the second electrode.

In one implementation of the light-emitting device, the active layer and the second semiconductor layer of the nitride semiconductor structure are disposed on one side of the first semiconductor layer, and wherein an upper surface of the other side of the first semiconductor layer opposite to the one side of the first semiconductor layer is exposed.

In one implementation of the light-emitting device, the first semiconductor layer, the active layer, and the second semiconductor layer of the nitride semiconductor structure are arranged in a line.

In one implementation of the light-emitting device, the silicide alloy includes titanium silicide ($TiSi_2$), cobalt silicide ($CoSi_2$) or nickel silicide ($NiSi_2$).

A second aspect of the present disclosure provides a display apparatus comprising: a package substrate having a plurality of circuit elements disposed therein, wherein the package substrate includes a first connection electrode and a second connection electrode; and a light-emitting device including a first electrode connected to the first connection electrode, and a second electrode connected to the second connection electrode, wherein the light-emitting device includes; a nitride semiconductor structure including a first semiconductor layer, an active layer and a second semiconductor layer; a passivation pattern disposed on an outer surface of the nitride semiconductor structure; the first electrode connected to the first semiconductor layer; and the second electrode spaced apart from the first electrode and connected to the second semiconductor layer, wherein each of the first electrode and the second electrode includes a silicide alloy.

In one implementation of the display apparatus, the light-emitting device further comprises a trench hole defined in one side of the nitride semiconductor structure so as to expose a portion of a surface of the first semiconductor layer, wherein the first electrode fills the trench hole so as to be connected to the first semiconductor layer, wherein an upper portion of the first electrode is coplanar with the second electrode, and wherein the first electrode faces the first connection electrode, while the second electrode faces the second connection electrode.

In one implementation of the display apparatus, the first electrode and the first connection electrode are attached to each other via a conductive adhesive layer, and wherein the second electrode and the second connection electrode are attached to each other via the conductive adhesive layer.

In one implementation of the display apparatus, the first semiconductor layer, the active layer, and the second semiconductor layer of the nitride semiconductor structure are arranged in a line, wherein the second electrode connected to the second semiconductor layer is connected to the first connection electrode of the package substrate via a conductive adhesive layer, wherein the first electrode connected to the first semiconductor layer is connected to the second connection electrode of the package substrate via the conductive adhesive layer, and wherein the first connection electrode and the second connection electrode are coplanar with each other.

In one implementation of the display apparatus, the silicide alloy includes titanium silicide ($TiSi_2$), cobalt silicide ($CoSi_2$) or nickel silicide ($NiSi_2$).

In one implementation of the display apparatus, the display apparatus further comprises: an insulating layer disposed on the second electrode including the silicide alloy; a bank disposed on the insulating layer and having a bank hole defined therein; a planarization film disposed on the bank; and a cover layer disposed on the planarization film.

A third aspect of the present disclosure provides a method for manufacturing a light-emitting device, the method comprising: forming a nitride semiconductor structure on a growth substrate, and forming first and second silicide reaction patterns respectively on both opposing sides of the nitride semiconductor structure, wherein the first and second silicide reaction patterns are spaced apart from each other;

forming a passivation pattern so as to cover an outer surface of the nitride semiconductor structure and so as to expose the first and second silicide reaction patterns; forming a metal film for silicide in contact with the passivation pattern and the first and second silicide reaction patterns; converting the first and second silicide reaction patterns, and portions of the metal film for the silicide in contact with the first and second silicide reaction patterns into first and second electrodes including a silicide alloy under a silicide reaction; and removing a portion of the metal film for the silicide where the silicide reaction does not occur.

In one implementation of the method for manufacturing the light-emitting device, the nitride semiconductor structure includes a first semiconductor layer, an active layer and a second semiconductor layer, wherein the nitride semiconductor structure further includes a trench hole defined in one side of the nitride semiconductor structure and extending through the second semiconductor layer and the active layer so as to expose a portion of a surface of the first semiconductor, and wherein the first silicide reaction pattern is formed to fill the trench hole.

In one implementation of the method for manufacturing the light-emitting device, the silicide alloy includes titanium silicide ($TiSi_2$), cobalt silicide ($CoSi_2$) or nickel silicide ($NiSi_2$).

A fourth aspect of the present disclosure provides a method for manufacturing a display apparatus, the method comprising: providing a light-emitting device, wherein the light-emitting device includes a nitride semiconductor structure including a first semiconductor layer, an active layer and a second semiconductor layer, and a second electrode connected to the second semiconductor layer; providing a package substrate having a plurality of circuit elements disposed therein, wherein the package substrate includes a first connection electrode and a second connection electrode; placing the light-emitting device on the package substrate such that the second electrode of the light-emitting device faces the first connection electrode of the package substrate; forming an insulating layer covering an exposed surface except for a rear surface of the first semiconductor layer of the light-emitting device; forming a barrier pattern including a first pattern opening extending through the insulating layer so as to expose a portion of a surface of the second connection electrode, and a second pattern opening exposing a portion of the rear surface of the first semiconductor layer; forming a silicide reaction pattern in the first pattern opening and the second pattern opening; forming a metal film for silicide in contact with the silicide reaction pattern; converting the silicide reaction pattern and a portion of the metal film for the silicide in contact with the silicide reaction pattern into a through-electrode connected to the second connection electrode and a first electrode under a silicide reaction, wherein each of the through-electrode and the first electrode includes a silicide alloy; and removing a portion of the metal film for the silicide where the silicide reaction does not occur. Moreover, there also provides a light-emitting device comprising: a nitride semiconductor structure; and a electrode connected to a semiconductor layer of the nitride semiconductor structure; and wherein the electrode includes a silicide alloy. Moreover, there also provides a display apparatus comprising: a package substrate; and the light-emitting device.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

What is claimed is:

1. A light-emitting device comprising:

a nitride semiconductor structure including a first semiconductor layer, an active layer on the first semiconductor layer, and a second semiconductor layer on the active layer;

a passivation pattern on an outer surface of the nitride semiconductor structure;

a first electrode connected to the first semiconductor layer;

a second electrode spaced apart from the first electrode and connected to the second semiconductor layer; and a trench hole through the second semiconductor layer, the active layer, and a portion of the first semiconductor layer without extending through an entire thickness of the first semiconductor layer, wherein the first electrode fills the trench hole and is in contact with the first semiconductor layer through the trench hole, and an upper portion of the first electrode that is not disposed in the trench hole is coplanar with the second electrode, wherein each of the first electrode and the second electrode includes a silicide alloy.

2. The light-emitting device of claim 1, wherein a side surface of the first semiconductor layer, a side surface of the active layer, and a side surface of the second semiconductor layer of the nitride semiconductor structure are aligned with each other and form an inclined surface, and the passivation pattern is on the inclined surface and an upper surface of the second semiconductor layer and extends to a side surface of the first electrode and a side surface of the second electrode.

3. The light-emitting device of claim 2, wherein the passivation pattern includes a first opening and a second opening that is spaced apart from the first opening, and the first electrode is in trench hole through the first opening and the second electrode is connected to the second semiconductor layer through the second opening.

4. The light-emitting device of claim 1, wherein the first semiconductor layer includes a first portion having a first height and a second portion having a second height that is lower than the first height such that a step is between the first portion and the second portion of the first semiconductor layer, and the active layer and the second semiconductor layer are on the first portion of the first semiconductor layer without being on the second portion of the first semiconductor layer, and wherein the passivation pattern is on an upper surface of the second portion of the first semiconductor layer and includes an opening, the first electrode is connected to the first semiconductor layer through the opening.

5. The light-emitting device of claim 1, wherein the silicide alloy includes titanium silicide, cobalt silicide, or nickel silicide.

6. A light-emitting device comprising:

a nitride semiconductor structure including a first semiconductor layer, an active layer on the first semiconductor layer, and a second semiconductor layer on the active layer;

a passivation pattern on an outer surface of the nitride semiconductor structure;

a first electrode connected to the first semiconductor layer; and a second electrode spaced apart from the first electrode and connected to the second semiconductor layer, wherein a first side surface of the first semiconductor layer at a first side of the first semiconductor layer, a first side surface of the active layer at a first side of the active layer, and a first side surface of the second semiconductor layer at a first side of the second semiconductor layer are aligned with each other and form a first inclined surface, and wherein a second side surface of the first semiconductor layer at a second side of the first semiconductor layer, a second side surface of the active layer at a second side of the active layer, and a second side surface of the second semiconductor layer at a second side of the second semiconductor layer are aligned with each other and form a second inclined surface.

7. The light-emitting device of claim 6, wherein the passivation pattern is on the first inclined surface and the second inclined surface and extends to an upper surface of the second semiconductor layer without extending to a lower surface of the first semiconductor layer.

8. The light-emitting device of claim 7, wherein the passivation pattern includes an opening on the upper surface of the second semiconductor layer and the second electrode is connected to the second semiconductor layer through the opening, and the first electrode is connected to the lower surface of the first semiconductor layer.

9. A display apparatus comprising:

a package substrate including a plurality of circuit elements, a first connection electrode, and a second connection electrode; and a light-emitting device connected to the package substrate, the light-emitting device including:

a nitride semiconductor structure including a first semiconductor layer, an active layer on the first semiconductor layer, and a second semiconductor layer on the active layer;

a passivation pattern on an outer surface of the nitride semiconductor structure;

a first electrode connected to the first semiconductor layer and the first connection electrode of the package substrate;

a second electrode spaced apart from the first electrode and connected to the second semiconductor layer and the second connection electrode of the package substrate, wherein each of the first electrode and the second electrode includes a silicide alloy, an insulating layer on the second electrode;

a bank on the insulating layer, the bank having a bank hole;

a planarization film on the bank, the planarization film filling the bank hole; and a cover layer on the planarization film.

10. The display apparatus of claim 9, wherein the light-emitting device further comprises:

a trench hole through the second semiconductor layer, the active layer, and a portion of the first semiconductor layer without extending through an entire thickness of the first semiconductor layer, wherein the first electrode fills the trench hole and is in contact with the first semiconductor layer through the trench hole and an upper portion of the first electrode that is not disposed in the trench hole is coplanar with the second electrode, and wherein the first electrode faces the first connection electrode and the second electrode faces the second connection electrode.

11. The display apparatus of claim 10, further comprising:

a conductive adhesive layer between the first electrode and the first connection electrode and between the second electrode and the second connection electrode, wherein the first electrode and the first connection electrode are connected to each other via the conductive adhesive layer, and the second electrode and the second connection electrode are connected to each other via the conductive adhesive layer.

12. The display apparatus of claim 9, wherein a first side surface of the first semiconductor layer at a first side of the first semiconductor layer, a first side surface of the active layer at a first side of the active layer, and a first side surface of the second semiconductor layer at a first side of the second semiconductor layer are aligned with each other and form a first inclined, wherein a second side surface of the first semiconductor layer at a second side of the first semiconductor layer, a second side surface of the active layer at a second side of the active layer, and a second side surface of the second semiconductor layer at a second side of the second semiconductor layer are aligned with each other and form a second inclined surface, wherein the second electrode that is connected to the second semiconductor layer is connected to the first connection electrode of the package substrate via a conductive adhesive layer, wherein the first electrode that is connected to the first semiconductor layer is connected to the second connection electrode of the package substrate via a through electrode that extends from the first electrode, and wherein the first connection electrode and the second connection electrode are coplanar with each other.

13. The display apparatus of claim 9, wherein the silicide alloy includes titanium silicide, cobalt silicide, or nickel silicide.

14. A light-emitting device comprising:

a nitride semiconductor structure;

a trench hole through at least a portion of the nitride semiconductor structure without extending through an entire thickness of the nitride semiconductor structure; and a first electrode filling the trench hole and being connected to a semiconductor layer of the nitride semiconductor structure through the trench hole, the first electrode including a silicide alloy.

15. A display apparatus comprising:

a package substrate; and the light-emitting device according to claim 14.

16. The light-emitting device of claim 14, wherein the nitride semiconductor structure comprises:

a first semiconductor layer;

an active layer on the first semiconductor layer; and a second semiconductor layer on the active layer.

17. The light-emitting device of claim 16, further comprising:

a second electrode spaced apart from the first electrode and connected to the second semiconductor layer; and wherein the first electrode connected to the first semiconductor layer, wherein the second electrode includes the silicide alloy.

* * * * *